United States Patent
Hu

(10) Patent No.: US 9,978,931 B2
(45) Date of Patent: May 22, 2018

(54) SYSTEMS AND METHODS FOR IMPLEMENTING ROBUST MAGNETOELECTRIC JUNCTIONS

(71) Applicant: Inston Inc., Santa Monica, CA (US)

(72) Inventor: Qi Hu, Cypress, CA (US)

(73) Assignee: Inston Inc., Santa Monica, CA (US)

( * ) Notice: Subject to any disclaimer, the term of this patent is extended or adjusted under 35 U.S.C. 154(b) by 0 days. days.

(21) Appl. No.: 15/044,888

(22) Filed: Feb. 16, 2016

(65) Prior Publication Data
US 2016/0240771 A1    Aug. 18, 2016

Related U.S. Application Data

(60) Provisional application No. 62/116,192, filed on Feb. 13, 2015.

(51) Int. Cl.
| | | |
|---|---|---|
| *H01L 29/82* | (2006.01) | |
| *H01L 43/00* | (2006.01) | |
| *H01L 43/08* | (2006.01) | |
| *H01L 43/10* | (2006.01) | |
| *G11C 11/16* | (2006.01) | |

(52) U.S. Cl.
CPC .......... *H01L 43/08* (2013.01); *G11C 11/161* (2013.01); *G11C 11/1675* (2013.01); *H01L 43/10* (2013.01)

(58) Field of Classification Search
CPC ......... H01L 43/08; H01L 43/02; H01L 43/10
USPC ....................................................... 257/421
See application file for complete search history.

(56) References Cited

U.S. PATENT DOCUMENTS

| | | |
|---|---|---|
| 4,038,596 A | 7/1977 | Lee |
| 6,040,996 A | 3/2000 | Kong |
| 6,114,719 A | 9/2000 | Dill et al. |
| 6,292,395 B1 | 9/2001 | Lin et al. |
| 6,529,412 B1 | 3/2003 | Chen et al. |

(Continued)

FOREIGN PATENT DOCUMENTS

| | | |
|---|---|---|
| WO | 2012159078 A2 | 11/2012 |
| WO | 2012159078 A3 | 3/2013 |

(Continued)

OTHER PUBLICATIONS

Lee, C.-H. et al., "Atomically thin p-n junctions with van der Waals heterointerfaces", Nature Nanotechnology, published online Aug. 10, 2014, vol. 9, pp. 676-681.

(Continued)

*Primary Examiner* — Theresa T Doan
(74) *Attorney, Agent, or Firm* — KPPB LLP

(57) ABSTRACT

Robust magnetoelectric junctions (MEJs) are disclosed. In one embodiment, an MEJ includes: a first fixed layer; a free layer; a seed layer; a cap layer; and a dielectric layer disposed between the first fixed layer and the free layer; where: one of the seed layer and the cap layer is disposed adjacently to a ferromagnetic layer; the first fixed layer is magnetized in a first direction; the free layer can adopt a magnetization direction that is either substantially parallel with or substantially antiparallel with the first direction; when a potential difference is applied across the MEJ, the coercivity of the free layer is reduced for the duration of the application of the potential difference; and at least one of the seed layer and the cap layer includes one of: Molybdenum, Tungsten, Iridium, Bismuth, Rhenium, and Gold.

12 Claims, 13 Drawing Sheets

(56) References Cited

U.S. PATENT DOCUMENTS

| | | | |
|---|---|---|---|
| 6,791,897 B2 | 9/2004 | Choi et al. | |
| 7,057,921 B2 | 6/2006 | Valet et al. | |
| 7,282,755 B2 | 10/2007 | Pakala et al. | |
| 7,403,442 B2 | 7/2008 | Larguier et al. | |
| 7,480,172 B2 | 1/2009 | Shi et al. | |
| 8,213,234 B2 | 7/2012 | Chen et al. | |
| 8,482,968 B2 | 7/2013 | Worledge et al. | |
| 8,760,930 B1 | 6/2014 | Kushnarenko et al. | |
| 8,804,425 B2 | 8/2014 | Chen et al. | |
| 8,841,739 B2 | 9/2014 | Amiri et al. | |
| 8,885,395 B2 | 11/2014 | Malmhall et al. | |
| 8,891,291 B2 | 11/2014 | Huai et al. | |
| 9,099,641 B2 | 8/2015 | Amiri et al. | |
| 9,129,691 B2 | 9/2015 | Amiri et al. | |
| 9,240,799 B1 | 1/2016 | Wang et al. | |
| 9,324,403 B2 | 4/2016 | Amiri et al. | |
| 9,355,699 B2 | 5/2016 | Amiri et al. | |
| 9,361,975 B2 | 6/2016 | Gilbert et al. | |
| 2002/0057594 A1 | 5/2002 | Hirai | |
| 2004/0241394 A1 | 12/2004 | Burrows | |
| 2005/0036361 A1* | 2/2005 | Fukuzumi | H01L 27/228 |
| | | | 365/158 |
| 2005/0062082 A1 | 3/2005 | Bucher et al. | |
| 2006/0133137 A1 | 6/2006 | Shin et al. | |
| 2006/0239110 A1 | 10/2006 | Ueda et al. | |
| 2007/0183190 A1 | 8/2007 | Eyckmans et al. | |
| 2009/0046529 A1 | 2/2009 | Chen et al. | |
| 2010/0080048 A1 | 4/2010 | Liu et al. | |
| 2010/0155687 A1 | 6/2010 | Reyes et al. | |
| 2010/0277974 A1 | 11/2010 | Yang | |
| 2011/0051502 A1 | 3/2011 | Rao et al. | |
| 2011/0260224 A1 | 10/2011 | Hidaka | |
| 2012/0176831 A1 | 7/2012 | Xiao et al. | |
| 2013/0015542 A1 | 1/2013 | Wang et al. | |
| 2013/0200323 A1 | 8/2013 | Pham et al. | |
| 2013/0343117 A1 | 12/2013 | Lua et al. | |
| 2014/0070344 A1 | 3/2014 | Amiri et al. | |
| 2014/0071728 A1 | 3/2014 | Khalili et al. | |
| 2014/0071732 A1 | 3/2014 | Khalili et al. | |
| 2014/0124882 A1 | 5/2014 | Amiri et al. | |
| 2014/0159121 A1 | 6/2014 | Fukami et al. | |
| 2014/0169085 A1 | 6/2014 | Wang et al. | |
| 2014/0177327 A1 | 6/2014 | Amiri et al. | |
| 2014/0197459 A1 | 7/2014 | Kis et al. | |
| 2014/0247653 A1 | 9/2014 | Wang et al. | |
| 2014/0334216 A1 | 11/2014 | Wang et al. | |
| 2015/0064492 A1 | 3/2015 | Rasic et al. | |
| 2015/0122315 A1 | 5/2015 | Hyeonjin et al. | |
| 2015/0137289 A1 | 5/2015 | Khalili | |
| 2015/0249096 A1 | 9/2015 | Lupino et al. | |
| 2015/0332749 A1 | 11/2015 | Khalili et al. | |
| 2016/0027842 A1 | 1/2016 | Khalili et al. | |
| 2016/0197263 A1* | 7/2016 | Hu | H01L 43/02 |
| | | | 365/158 |
| 2016/0204162 A1 | 7/2016 | Hu et al. | |
| 2016/0358973 A1 | 12/2016 | Katine et al. | |
| 2017/0033281 A1 | 2/2017 | Hu | |
| 2017/0084322 A1 | 3/2017 | Wang et al. | |
| 2017/0323929 A1 | 11/2017 | Bessonov et al. | |
| 2017/0372761 A1 | 12/2017 | Lee | |
| 2017/0372762 A1 | 12/2017 | Lee | |

FOREIGN PATENT DOCUMENTS

| | | |
|---|---|---|
| WO | 2018005698 A1 | 1/2018 |
| WO | 2018005699 A1 | 1/2018 |

OTHER PUBLICATIONS

Lee, G.-H. et al., "Flexible and Transparent MoS2 Field-Effect Transistors on Hexagonal Boron Nitride-Graphene Heterostructures", ACSNano, published online Aug. 8, 2013, vol. 7, No. 9, pp. 7931-7936.

Lee, Y.-H. et al., "Synthesis of Large-Area MoS2 Atomic Layers with Chemical Vapor Deposition", Advanced Materials, Mar. 30, 2012, vol. 24, pp. 2320-2325.

Lee et al., "A Word Line Pulse Circuit Technique for Reliable Magnetoelectric Random Access Memory", IEEE Transactions on Very Large Scale Integration (VLSI) Systems, Jul. 2017, vol. 25, No. 7, pp. 2027-2034.

Lee et al., "Design of a Fast and Low-Power Sense Amplifier and Writing Circuit for High-Speed MRAM", IEEE Transactions on Magnetics, May 2015, vol. 51, No. 5, 7 pgs.

Lee et al., "Low-Power, High-Density Spintronic Programmable Logic with Voltage-Gated Spin Hall Effect in Magnetic Tunnel Junctions", IEEE Magnetics Letters, May 4, 2016, vol. 7, 5 pgs.

Lee et al., "Source Line Sensing in Magneto-Electric Random-Access Memory to Reduce Read Disturbance and Improve Sensing Margin", IEEE Magnetics Letter, Jun. 20, 2016, vol. 7, 5 pgs.

Li, L. et al., "Black phosphorus field-effect transistors", Nature Nanotechnology, May 2014, vol. 9, pp. 372-377.

Lin, Y.-M. et al., "Wafer-Scale Graphene Integrated Circuit", Science, Jun. 10, 2011. vol. 332, pp. 1294-1297.

Liu, W. et al., "Role of Metal Contacts in Designing High-Performance Monolayer n-Type WSe2 Field Effect Transistors", Nano Letters, Mar. 25, 2013, vol. 13, pp. 1983-1990.

Liu, Leitao et al., "On Monolayer MoS2 Field-Effect Transistors at the Scaling Limit", IEEE Transactions on Electron Devices, vol. 60, No. 12, Dec. 2013, pp. 4133-4139.

Mandelman et al., "Challenges and future directions for the scaling of dynamic random-access Memory (DRAM)", IBM. F. Res & Dev, Mar./May 2002, vol. 46, No. 2/3, pp. 187-212.

Meng et al., "Electric field control of spin re-orientation in perpendicular magnetic tunnel junctions—CoFeB and MgO thickness dependence", Applied Physics Letters, Jul. 31, 2014, vol. 105, pp. 042410-1-042410-5.

Miro, P. et al., "An atlas of two-dimensional materials", Chemical Society Reviews, Mar. 5, 2014, vol. 43, pp. 1983-1990.

Novoselov, K. S., "Electric Field Effect in Atomically Thin Carbon Films", Science, Oct. 22, 2004, vol. 306, pp. 666-669.

Ong, P. et al., "Strain-induced Giant Magnetoelectric Effect in Heavy Metal/Magnet/Insulator Junctions", 59th Conference on Magnetism and Magnetic Materials, Honolulu, Hawaii, USA, EE-13 (2014), 2 pgs.

Ong et al., "Giant voltage modulation of magnetic anisotropy in strained heavy metal/magnet/insulator heterostructures", Physical Review B 92, 020407(R), Jul. 20, 2015, pp. 020407-1-020407-5.

Otsuka et al., "A 4Mb conductive-Bridge Resistive Memory with 2.3GB/s Read-Throughput and 216MB/s Program-Throughput", 2011 IEEE International Solid-State Circuits Conference, ISSCC2011, Feb. 22, 2011, pp. 210-211.

Pospischil, A. et al., "Solar-energy conversion and light emission in an atomic monolayer p-n. diode", Nature Nanotechnology, published online Mar. 9, 2014, vol. 9, pp. 257-261.

Qazi et al., "Challenges and Directions for Low-Voltage SRAM", IEEE Design & Test of Computers, Jan./Feb. 2011, pp. 32-43.

Radisavljevic, B. et al., "Single-Layer MoS2 Transistors", Nature Nanotechnology, published online Jan. 30, 2011, vol. 6, pp. 147-150.

Rippard et al., "Thermal relaxation rates of magnetic nanoparticles in the presence of magnetic fields and spin-transfer effects", Physical Review B, Aug. 29, 2011, pp. 064439-1-064439-7.

Roy, T. et al., "Field-Effect Transistors Built from All Two-Dimensional Material Components", ACSNano, published online Apr. 28, 2014, vol. 8, No. 6, pp. 6259-6264.

Shamsi et al., "Reliable and High Performance STT-MRAM Architectures Based on Controllable-Polarity Devices", IEEE International Conference on Computer Design (ICCD), Oct. 18-21, 2015, pp. 343-350.

Shiota, Y. et al., "Induction of coherent magnetization switching in a few atomic layers of FeCo using voltage pulses", Nature Materials, published online Nov. 13, 2011, vol. 11, pp. 39-43.

Shiota et al., "Pulse voltage-induced dynamic magnetization switching in magnetic tunneling junctions with high resistance-area product", Applied Physics Letters, Sep. 5, 2012, vol. 101, pp. 102406-1-102406-4.

(56) References Cited

OTHER PUBLICATIONS

Song et al., "Bidirectional Two-Terminal Switching Device for Crossbar Array Architecture", IEEE Electron Device Letters, Aug. 2011, vol. 32, No. 8, pp. 1023-1025.

Tian, H. et al., "Novel Field-Effect Schottky Barrier Transistors Based on Graphene-MoS2 Heterojunctions", Scientific Reports, Aug. 11, 2014, vol. 4, 9 pgs.

Tsuchida et al., "A 64Mb MRAM with Clamped-Reference and Adequate-Reference Schemes", IEEE International Solid-State Circuits Conference, ISSCC 2010/Session 14/ Non-Volatile Memory, Feb. 9, 2010, pp. 258-260.

Wang, H. et al., "Integrated Circuits Based on Bilayer MoS2 Transistors", Nano Letters, Aug. 3, 2012, vol. 12, pp. 4674-4680.

Wang, Q. H., "Electronics and optoelectronics of two-dimensional transition metal dichalcogenides", Nature Nanotechnology, published online Nov. 6, 2012, vol. 7, pp. 699-712.

Wang, X. et al., "Chemical Vapor Deposition Growth of Crystalline Monolayer MoSe2", ACS Nano, published online Mar. 29, 2014, vol. 8, No. 5, pp. 5125-5131.

Wang et al., "Comparative Evaluation of Spin-Transfer-Torque and Magnetoelectric Random Access Memory", IEEE Journal on Emerging and Selected Topics in Circuits and Systems, Jun. 2016, vol. 6, No. 2, pp. 134-145.

Wang et al., "Design and Implementation of dynamic Word-Line Pulse Write", IEEE, Dec. 2-5, 2012, pp. 116-119.

Wang et al., "Electric-field-assisted switching in magnetic tunnel junctions", Nature Materials, published online Nov. 13, 2011, vol. 11, pp. 64-68.

Wang et al., "Low-power non-volatile spintronic memory: STT-RAM and beyond", J. Phys. D: Appl. Phys., Jan. 31, 2013, vol. 46, 10 pgs.

Wang et al., "Magnetoelectric Random Access Memory-Based Circuit Design by Using Voltage-Controlled Magnetic Anisotrophy in Magnetic Tunnel Junctions", IEEE Transactions on Nanotechnology, Nov. 2015, vol. 14, No. 6, pp. 992-997.

Worledge et al., "Spin torque switching of perpendicular Ta | CoFeB | MgO-based magnetic tunnel junctions", Applied Physics Letters, Jan. 10, 2011, vol. 98, pp. 022501-1-022501-3.

Yoshimoto et al., "A 40-nm 8T SRAM with Selective Source Line Control of Read Bitlines and Address Preset Structure", Published in Custom Integrated Circuits Conference (CICC), IEEE , Sep. 22-25, 2013, 4 pgs.

Yu et al., "Highly efficient gate-tunable photocurrent generation in vertical heterostructures of layered materials", Nature Nanotechnology, published online Oct. 27, 2013, vol. 8, pp. 952-958.

Yu et al., "Vertically stacked multi-heterostructures of layered materials for logic transistors and complementary inverters", Nature Materials, published online Dec. 16, 2012, Mar. 2013, vol. 12, pp. 246-252.

Zhan, Y. et al., "Large-Area Vapor-Phase Growth and Characterization of MoS2 Atomic Layers on a SiO2 Substrate", Small, Feb. 15, 2012, vol. 8, No. 7, pp. 966-971.

Zhang, Y. et al., "Controlled Growth of High-Quality Monolayer WS2 Layers on Sapphire and Imaging Its Grain Boundary", ACSNano, published online Sep. 18, 2013, vol. 7, No. 10, pp. 8963-8971.

Akinwande et al., "Two-dimensional flexible nanoelectronics", Nature Communications, Dec. 17, 2014, vol. 5, pp. 1-12.

Alzate et al., "Voltage-Induced Switching of CoFeB—MgO Magnetic Tunnel Junctions", 56th Conference on Magnetism and Magnetic Materials, Scottsdale, Arizona, USA, EG-11 (2011), 1 pg.

Alzate et al., "Voltage-induced switching of nanoscale magnetic tunnel junctions", Conference Paper in Electron Devices Meeting, 1988. IEDM '88. Technical Digest, International, Jan. 2012, pp. 29.5.1-29.5.4.

Amiri et al., "Electric-Field-Controlled Magnetoelectric RAM: Progress, Challenges, and Scaling", IEEE Transactions on Magnetics, Nov. 2015, vol. 51, No. 11, 7 pgs.

Amiri et al., "Electric-field-induced thermally assisted switching of monodomain magnetic bits", Journal of Applied Physics, Jan. 7, 2013, vol. 113, pp. 013912-1-013912-5.

Amiri et al., "Switching current reduction using perpendicular anisotropy in CoFeB—MgO magnetic tunnel junctions", Applied Physics Letters, Mar. 17, 2011, vol. 98, pp. 112507-1-112507-3.

Amiri et al., "Voltage-Controlled Magnetic Anisotropy in Spintronic Devices", SPIN, Oct. 29, 2012, vol. 2, No. 3, pp. 1240002-1-1240002-9.

Bae et al., "Roll-to-roll production of 30-inch graphene films for transparent electrodes", Nature Nanotechnology, published online Jun. 20, 2010, vol. 5, pp. 574-578.

Britnell et al., "Resonant tunnelling and negative differential conductance in graphene transistors", Nature Communications, Apr. 30, 2013, vol. 4, 5 pgs.

Britnell et al., "Strong Light-Matter Interactions in Heterostructures of Atomically Thin Films", Science, Jun. 14, 2013, vol. 340, pp. 1311-1314.

Brown, "Thermal Fluctuations of a Single-Domain Particle", Physical Review, Jun. 1, 1963, vol. 130, No. 5, pp. 1677-1686.

Buscema et al., "Photovoltaic effect in few-layer black phosphorus PN junctions defined by local electrostatic gating", Nature Communications, Aug. 28, 2014, vol. 5, 6 pgs.

Butler et al., "Progress, Challenges, and Opportunities in Two-Dimensional Materials Beyond Graphene", ACSNano, Mar. 6, 2013, vol. 7, No. 4, pp. 2898-2926.

Chang et al., "A 0.5V 4Mb Logic-Process compatible Embedded Resistive RAM (ReRAM( in 65nm CMOS Using Low-voltage Current-Mode Sensing Scheme with 45ns Random Read Time", 2012 IEEE International solid-State Circuits Conference, ISSCC 2012, Feb. 22, 2012, pp. 434-436.

Chatterjee et al., "Dual-Source-Line-Bias Scheme to Improve the Read Margin and Sensing Accuracy of STTRAM in Sub-90-nm Nodes", IEEE Transactions on Circuits and Systems—II: Express Briefs, Mar. 8, 2010, vol. 57, No. 3, pp. 208-212.

Chen et al., "A 40 nm fully Functional SRAM with BL Swing and WL Pulse Measurement Scheme for Eliminating a Need for Additional Sensing Tolerance Margins", Symposium on VLSI Circuits Digest of Technical Papers, Jun. 15-17, 2011, pp. 70-71.

Chen et al., "Compact Measurement Schemes for Bit-Line Swing, Sense Amplifier Offset Voltage, and Word-Line Pulse Width to Characterize Sensing Tolerance Margin in a 30 nm Fully Functional Embedded SRAM", IEEE Journal of Solid-State Circuits, Apr. 2012, vol. 47, No. 4, pp. 969-980.

Choi et al., "Lateral MoS2 p-n Junction Formed by Chemical Doping for Use in High-Performance Optoelectronics", ACSNano, Aug. 18, 2014, vol. 8, No. 9, pp. 9332-9340.

Dorrance et al., "Diode-MTJ Crossbar Memory Cell Using Voltage-Induced Unipolar Switching for High-Density MRAM", IEEE Electron Device Letters, Jun. 2013, vol. 34, No. 6, pp. 753-755.

Fukada et al., "Non-volatile Random Access Memory and NAND Flash Memory Integrated Solid-State Drives with Adaptive Codeword Error Correcting Code for 3.6 Times Acceptable Raw Bit Error Rate Enhancement and 97% Power Reduction", Japanese Journal of Applied Physics, Apr. 20, 2011, vol. 50, pp. 04DE09-1-04DE09-7.

Furchi et al., "Photovoltaic Effect in an Electrically Tunable van der Waals Heterojunction", Nano Letters, Jul. 24, 2014, vol. 14, pp. 4785-4791.

Geim et al., "Van der Waals heterostructures", Nature, Jul. 25, 2013, vol. 499, pp. 419-425.

Georgiou et al., "Vertical field-effect transistor based on graphene-WS2 heterostructures for flexible and transparent electronics", Letters Nature Nanotechnology, published online Dec. 23, 2012, vol. 8, pp. 100-103.

Grezes et al., "Ultra-low switching energy and scaling in electric-field-controlled nanoscale magnetic tunnel junctions with high resistance-area product", Applied Physics Letters, 2016, vol. 108, pp. 012403-1-012403-5.

Haigh, S. J., "Cross-sectional imaging of individual layers and buried interfaces of graphene-based heterostructures and superlattices", Letters Nature Materials, published online Jul. 29, 2012, Sep. 2012, vol. 11, pp. 764-767.

(56) References Cited

OTHER PUBLICATIONS

Halupka et al., "Negative-Resistance Read and Write Schemes for SST-MRAM in 0.13μm CMOS", 2010 IEEE International Solid-State Circuits Conference, ISSCC 2010, Feb. 9, 2010, pp. 256-258.

Huai et al., "Observation of spin-transfer switching in deep submicron-sized and low-resistance magnetic tunnel junctions", Applied Physics Letter, Apr. 19, 2004, vol. 84, No. 16, pp. 3118-3120.

Huang, J.-K. et al., "Large-Area Synthesis of Highly Crystalline WSe2 Monolayers and Device Applications", ACSNano, published online Dec. 14, 2013, vol. 8, No. 1, pp. 923-930.

Ikeda et al., "A perpendicular-anisotropy CoFeB—MgO magnetic tunnel junction", Nature Materials, Sep. 2010 (published online Jul. 11, 2010), vol. 9, pp. 721-724.

Ikegami et al., "MTJ-Based "Normally-Off Processors" with Thermal Stability Factor Engineered Perpendicular MTJ, L2 Cache Based on 2T-2MTJ Cell, L3 and Last Level Cache Based on 1T-1MTJ Cell and Novel Error Handling Scheme", IEEE International Electron Devices Meeting (IEDM), Dec. 7-9, 2015, pp. 25.1.1-25.1.4.

Jariwala, D. et al., "Emerging Device Applications for Semiconducting Two-Dimensional Transition Metal Dichalcogenides", ACSNano, published online Jan. 29, 2014, vol. 8, No. 2, pp. 1102-1120.

Kalitsov et al., "Bias dependence of tunneling magnetoresistance in magnetic tunnel junctions with asymmetric barriers", Journal of Physics: Condensed Matter, Nov. 6, 2013, vol. 25, 496005, 8 pgs.

Kanai et al., "Electric field-induced magnetization reversal in a perpendicular-anisotropy CoFeB—MgO magnetic tunnel junction", Applied Physics Letters, Sep. 18, 2012, vol. 101, pp. 122403-1-122403-3.

Kanai et al., "Magnetization switching in a CoFeB/MgO magnetic tunnel junction by combining spin-transfer torque and electric field-effect", Applied Physics Letters, May 30, 2014, vol. 104, pp. 212406-1-212406-3.

Kang et al., "High-Speed, Low-Power, Magnetic Non-Volatile Flip-Flop with voltage-Controlled, Magnetic Anisotropy Assistance", IEEE Magnetics Letters, Nov. 8, 2016, vol. 7, 5 pgs.

Katine et al., "Current-Driven magnetization Reversal and Spin-Wave Excitations in Co/Cu/Co Pillars", Physical Review Letters, Apr. 3, 2000, vol. 84, No. 14, pp. 3149-3152.

Katine et al., "Device implications of spin-transfer torques", Journal of Magnetism and Magnetic Materials, Apr. 2008, vol. 320, pp. 1217-1226.

Kim et al., "Constant-Load Energy Recovery Memory for Efficient High-Speed Operation", International Symposium on Low Power Electronics and Design, ISLPED '04, Aug. 11, 2004, pp. 240-243.

Kobayashi, T. et al., "Production of a 100-m-long high-quality graphene transparent conductive film by roll-to-roll chemical vapor deposition and transfer process", Applied Physics Letters, Jan. 17, 2013, vol. 102, pp. 023112-1-023112-4.

Landau et al., "On the theory of the dispersion of magnetic permeability in ferromagnetic bodies", Ukr. J. Phys., 2008, vol. 53, Special Issue, pp. 14-22.

International Search Report and Written Opinion for International Application No. PCT/US2017/039832, Search completed Aug. 8, 2017, dated Aug. 29, 2017, 6 Pgs.

International Search Report and Written Opinion for International Application No. PCT/US2017/039833, Search completed Aug. 22, 2017, dated Sep. 6, 2017, 22 Pgs.

Emori et al., "Large voltage-induced modification of spin-orbit torques in Pt/Co/GdOx", Appl. Phys. Lett. 105, 222401 (2014).

Newhouse-Illige et al., "Voltage-controlled interlayer coupling in perpendicularly magnetized magnetic tunnel junctions", Nat. Commun. 8, 15232 doi: 10.1038/ncomms15232, Published May 16, 2017.

* cited by examiner

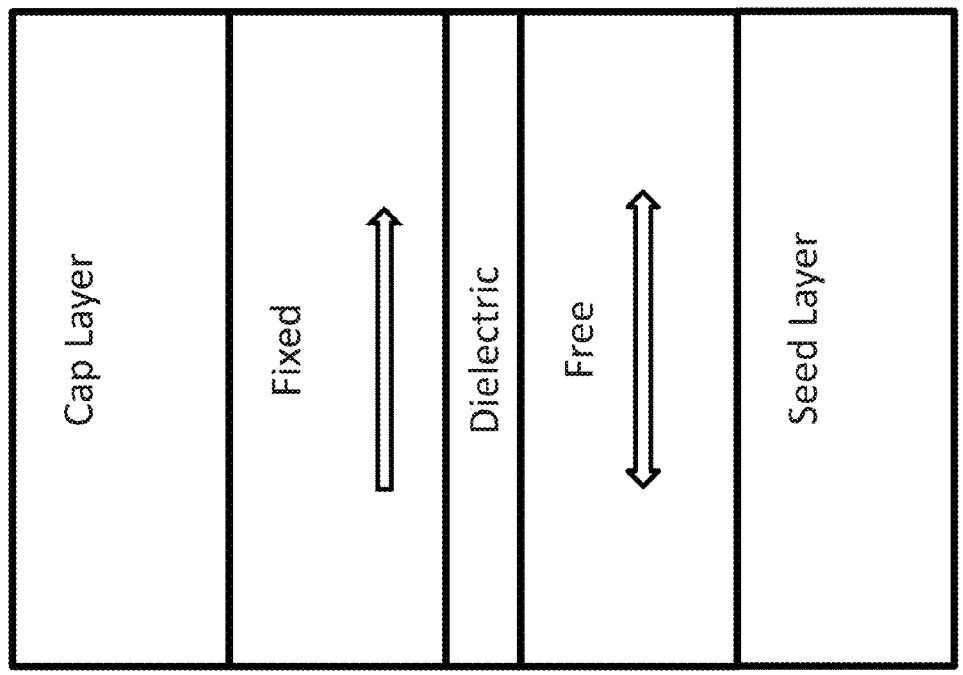

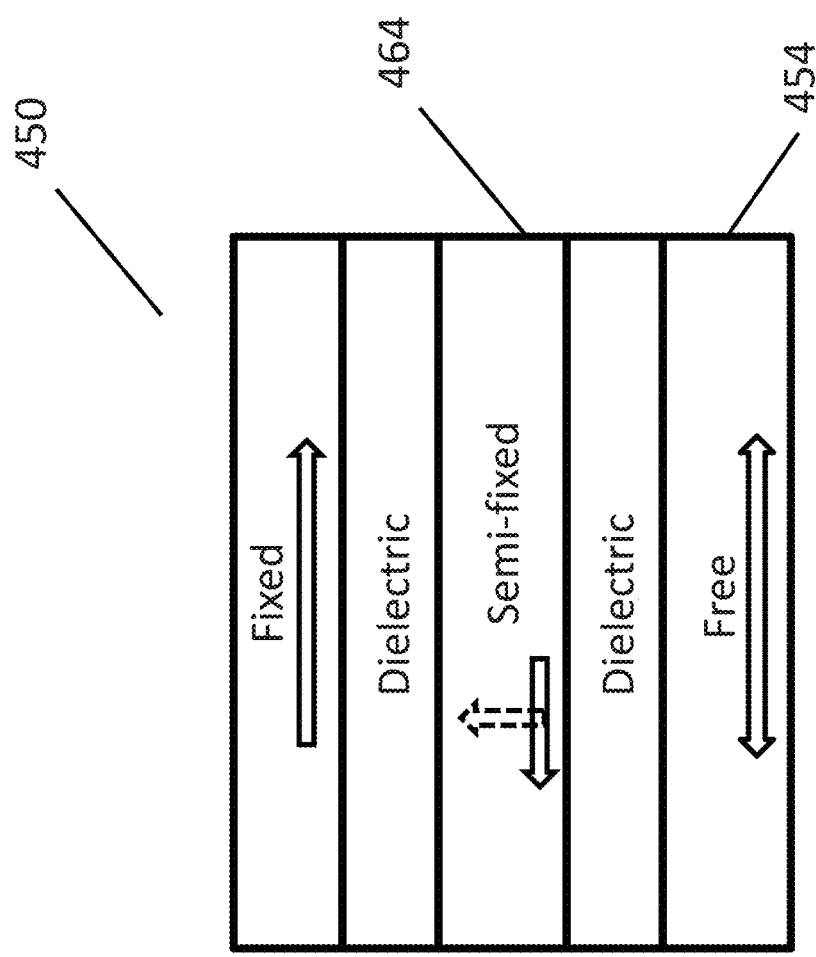

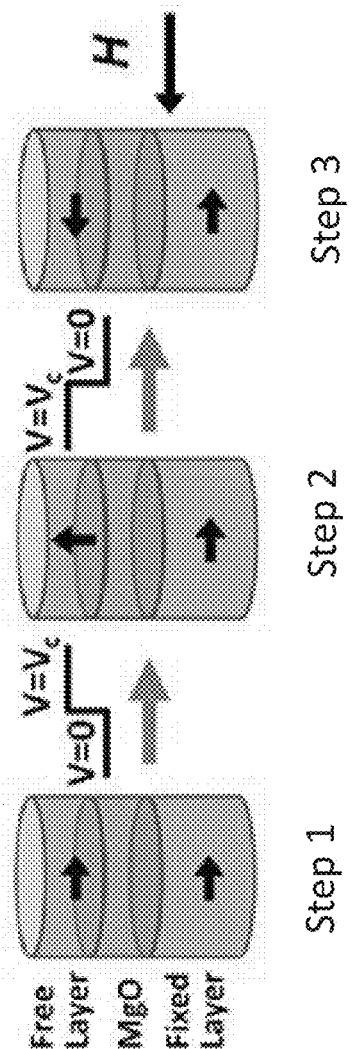
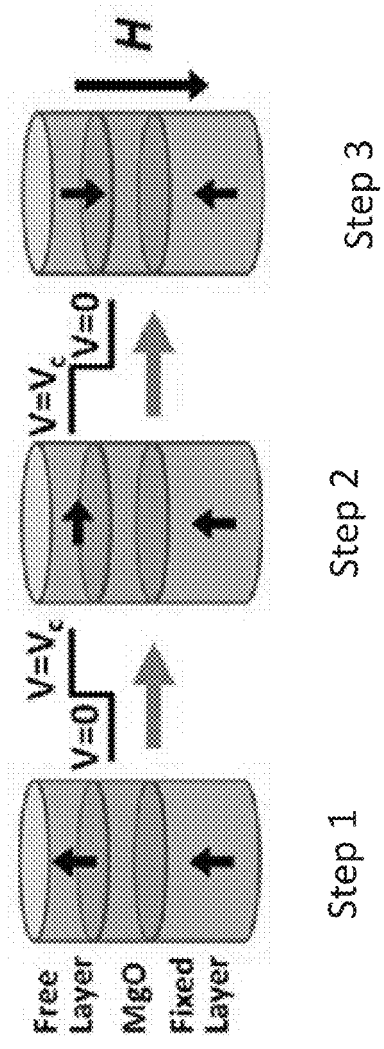

SYSTEMS AND METHODS FOR IMPLEMENTING ROBUST MAGNETOELECTRIC JUNCTIONS

CROSS-REFERENCE TO RELATED APPLICATIONS

The current application claims priority to U.S. Provisional Application No. 62/116,192, filed Feb. 13, 2015, the disclosure of which is incorporated herein by reference.

FIELD OF THE INVENTION

The present invention generally relates to the implementation of magnetoelectric junctions.

BACKGROUND OF THE INVENTION

Devices that rely on electricity and magnetism underlie much of modern electronics. Researchers have recently begun to develop and implement devices that take advantage of both electricity and magnetism in spin-electronic (or so-called "spintronic") devices. These devices utilize quantum-mechanical magnetoresistance effects, such as giant magnetoresistance (GMR) and tunnel magnetoresistance (TMR). GMR and TMR principles regard how the resistance of a thin film structure that includes alternating layers of ferromagnetic and non-magnetic layers depends upon whether the magnetizations of ferromagnetic layers are in a parallel or antiparallel alignment. For example, magnetoresistive random-access memory (MRAM) is a technology that is being developed that typically utilizes TMR phenomena in providing for alternative random-access memory (RAM) devices. In a typical MRAM bit, data is stored in a magnetic structure that includes two ferromagnetic layers separated by an insulating layer—this structure is conventionally referred to as a magnetic tunnel junction (MTJ). The magnetization of one of the ferromagnetic layers (the fixed layer) is permanently set to a particular direction, while the other ferromagnetic layer (the free layer) can have its magnetization direction free to change. Generally, the MRAM bit can be written by manipulating the magnetization of the free layer such that it is either parallel or antiparallel with the magnetization of the fixed layer; and the bit can be read by measuring its resistance (since the resistance of the bit will depend on whether the magnetizations are in a parallel or antiparallel alignment).

MRAM technologies initially exhibited a number of technological challenges. The first generation of MRAM utilized the Oersted field generated from current in adjacent metal lines to write the magnetization of the free layer, which required a large amount of current to manipulate the magnetization direction of the bit's free layer when the bit size shrinks down to below 100 nm. Thermal assisted MRAM (TA-MRAM) utilizes heating of the magnetic layers in the MRAM bits above the magnetic ordering temperature to reduce the write field. This technology also requires high power consumption and long wire cycles. Spin transfer torque MRAM (STT-MRAM) utilizes the spin-polarized current exerting torque on the magnetization direction in order to reversibly switch the magnetization direction of the free layer. The challenge for STT-MRAM remains that the switching current density needs to be further reduced.

SUMMARY OF THE INVENTION

Systems and methods in accordance with embodiments of the invention implement robust magnetoelectric junctions.

In one embodiment, a magnetoelectric junction includes: a first ferromagnetic fixed layer; a ferromagnetic free layer that is magnetically anisotropic; a seed layer; a cap layer; and a dielectric layer that is disposed between the first ferromagnetic fixed layer and the ferromagnetic free layer; where: one of the seed layer and the cap layer is disposed adjacently to a ferromagnetic layer; the first ferromagnetic fixed layer is magnetized in a first direction; the ferromagnetic free layer can adopt a magnetization direction that is either substantially parallel with or substantially antiparallel with the first direction; when a potential difference is applied across the aggregate of the cap layer, the first ferromagnetic fixed layer, the dielectric layer, the ferromagnetic free layer, and the seed layer, the coercivity of the ferromagnetic free layer is reduced for the duration of the application of the potential difference; and at least one of the seed layer and the cap layer includes one of: Molybdenum, Tungsten, Iridium, Bismuth, Rhenium, and Gold.

In another embodiment, the magnetoelectric junction is configured such that it demonstrates stronger perpendicular magnetic anisotropy relative to a magnetoelectric junction that is identical except that its seed and cap layers do not include any of: Molybdenum, Tungsten, Iridium, Bismuth, Rhenium, and Gold.

In yet another embodiment, the magnetoelectric junction is configured such that it demonstrates stronger tunnel magnetoresistance characteristics relative to a magnetoelectric junction that is identical except that its seed and cap layers do not include any of: Molybdenum, Tungsten, Iridium, Bismuth, Rhenium, and Gold.

In still another embodiment, the magnetoelectric junction is configured such that it demonstrates stronger voltage controlled magnetic anisotropy response relative to a magnetoelectric junction that is identical except that its seed and cap layers do not include any of: Molybdenum, Tungsten, Iridium, Bismuth, Rhenium, and Gold.

In still yet another embodiment, the magnetoelectric junction is configured such that it demonstrates stronger perpendicular magnetic anisotropy, stronger tunnel magnetoresistance characteristics, and a stronger voltage controlled magnetic anisotropy response, relative to a magnetoelectric junction that is identical except that its seed and cap layers do not include any of: Molybdenum, Tungsten, Iridium, Bismuth, Rhenium, and Gold.

In a further embodiment, either the seed or cap layer includes a combination of at least two of: Molybdenum, Tungsten, Iridium, Bismuth, Rhenium, and Gold.

In a yet further embodiment, the seed or cap layer further includes one of: Tantalum, Ruthenium, Platinum, and Palladium.

In a still further embodiment, one of the seed layer and the cap layer is disposed adjacently to one of: the first ferromagnetic fixed layer and the ferromagnetic free layer.

In a still yet further embodiment, each of the seed layer and the cap layer is disposed adjacently to one of: the first ferromagnetic fixed layer and the ferromagnetic free layer.

In another embodiment, a magnetoelectric junction further includes a second dielectric layer disposed proximate the ferromagnetic free layer, where the extent of the reduction of the coercivity when a potential difference is applied across the aggregate of the cap layer, the first ferromagnetic fixed layer, the dielectric layer, the ferromagnetic free layer, and the seed layer is enhanced by the presence of the second dielectric layer.

In still another embodiment, a magnetoelectric junction further includes a second fixed ferromagnetic layer.

In yet another embodiment, a magnetoelectric junction further includes a semi-fixed layer.

In still yet another embodiment, a magnetoelectric junction includes: a first ferromagnetic fixed layer; a ferromagnetic free layer that is magnetically anisotropic; a seed layer; a cap layer; and a dielectric layer that is disposed between the first ferromagnetic fixed layer and the ferromagnetic free layer; where: one of the seed layer and the cap layer is disposed adjacently to a ferromagnetic layer; the first ferromagnetic fixed layer is magnetized in a first direction; the ferromagnetic free layer can adopt a magnetization direction that is either substantially parallel with or substantially antiparallel with the first direction; when a potential difference is applied across the aggregate of the cap layer, the first ferromagnetic fixed layer, the dielectric layer, the ferromagnetic free layer, and the seed layer, the coercivity of the ferromagnetic free layer is reduced for the duration of the application of the potential difference; and at least one of the seed layer and the cap layer includes one of: Molybdenum and Tungsten.

In a further embodiment, at least one of the seed layer and the cap layer includes both Molybdenum and Tungsten.

In a still further embodiment, the seed layer or cap layer further includes one of: Tantalum, Ruthenium, or Palladium.

In a yet further embodiment, one of the seed layer and the cap layer is disposed adjacently to one of: the first ferromagnetic fixed layer and the ferromagnetic free layer.

In a still yet further embodiment, each of the seed layer and the cap layer is disposed adjacently to one of: the first ferromagnetic fixed layer and the ferromagnetic free layer.

In another embodiment, the magnetoelectric junction is configured such that it demonstrates stronger perpendicular magnetic anisotropy relative to a magnetoelectric junction that is identical except that its seed and cap layers do not include any of: Molybdenum, Tungsten, Iridium, Bismuth, Rhenium, and Gold.

In still another embodiment, the magnetoelectric junction is configured such that it demonstrates stronger tunnel magnetoresistance characteristics relative to a magnetoelectric junction that is identical except that its seed and cap layers do not include any of: Molybdenum, Tungsten, Iridium, Bismuth, Rhenium, and Gold.

In yet another embodiment, the magnetoelectric junction is configured such that it demonstrates stronger voltage controlled magnetic anisotropy response relative to a magnetoelectric junction that is identical except that its seed and cap layers do not include any of: Molybdenum, Tungsten, Iridium, Bismuth, Rhenium, and Gold.

BRIEF DESCRIPTION OF THE DRAWINGS

FIGS. 1A-1B illustrates an MEJ that includes in-plane magnetization in accordance with certain embodiments of the invention.

FIGS. 4A and 4B illustrate MEJs that include a semi-fixed layer in accordance with certain embodiments of the invention.

FIGS. 5A and 5B illustrate the operation of an MEJ in accordance with certain embodiments of the invention.

DETAILED DESCRIPTION

Figure 1A:
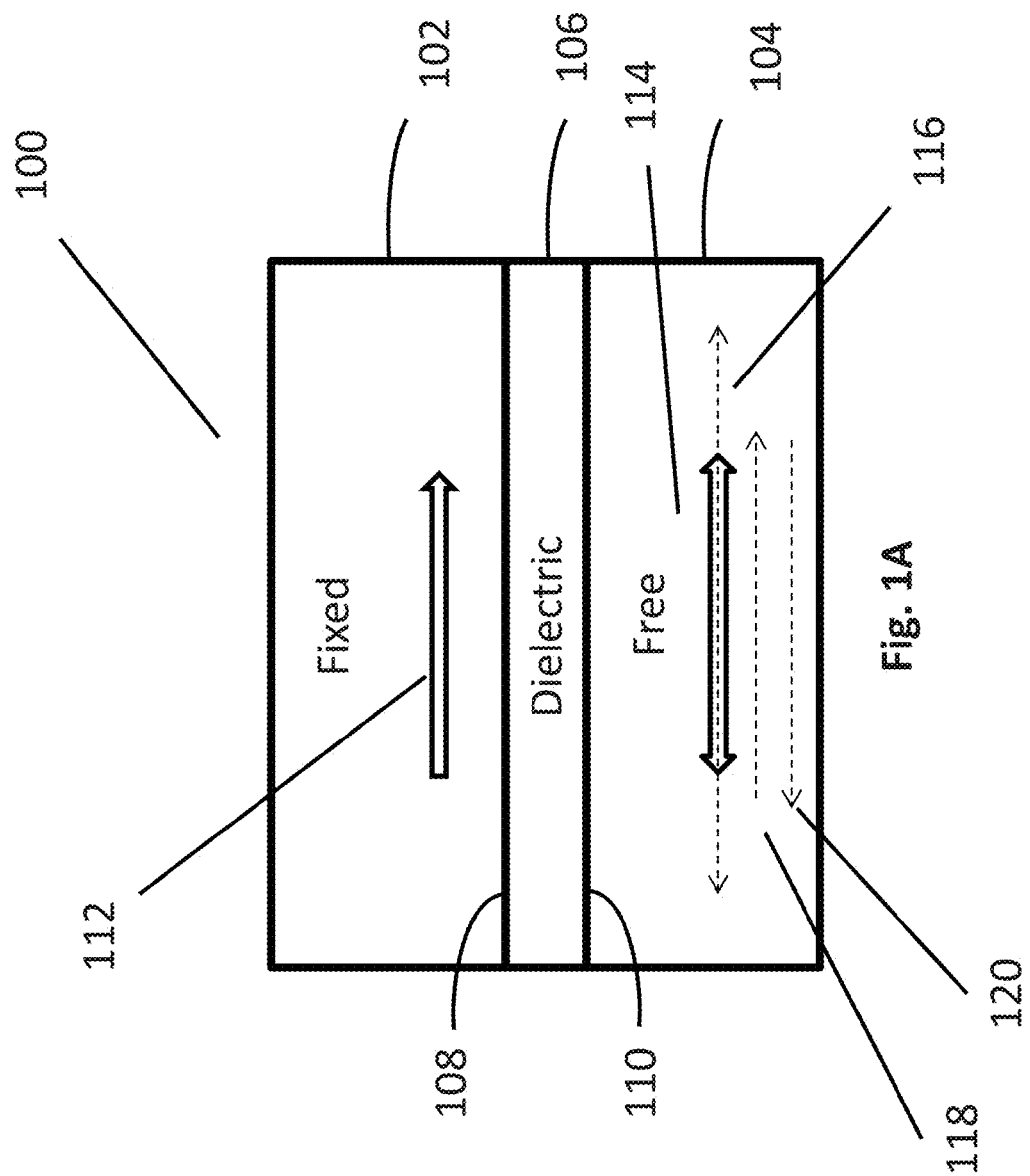

Turning now to the drawings, systems and methods for implementing robust magnetoelectric junctions are illustrated. Previous efforts at implementing electromagnetic components that utilize magnetoresistance phenomena to achieve two information states (i.e. one bit of information), e.g. magnetic tunnel junctions (MTJs), were largely directed at using a current to manipulate the magnetization configuration (e.g. whether the magnetization directions of the fixed layer and the free layer are parallel or anti-parallel to each other) of the magnetic layers in the device. However, the currents required were often considerably large, particularly in cases where MTJs were used in MRAM configurations. Indeed, in applications that require low-power operation, the requirement of a considerably large current made the implementation of devices that rely on MTJs less commercially viable. Accordingly, voltage-controlled magnetic anisotropy-based MTJs (VMTJs) that generally allow MTJs to utilize an electric field to facilitate the switching of the magnetization direction of the free layer (i.e., 'write' to it) as opposed to (or in some cases, in addition to) using a current to do so were developed and reported. See e.g., International Patent Application Number PCT/US2012/038693, entitled "Voltage-Controlled Magnetic Anisotropy (VCMA) Switch and Magneto-electric Memory (MERAM)," by Khalili Amiri et al., the disclosure of which is herein incorporated by reference in its entirety. Generally, the coercivity of the free layer of a VMTJ can be reduced using voltage-controlled magnetic anisotropy (VCMA) phenomena, thereby making the free layer more easily switched to the opposite direction ('writeable'). It has been demonstrated that such devices employing VCMA principles result in marked performance improvements over conventional MTJs. Note that in the instant application, the term 'magnetoelectric junction' (MEJ) is used to refer to devices that use VCMA principles to help them realize two distinct information states, e.g. voltage-controlled magnetic anisotropy-based MTJs (VMTJs) as well as the VCMA switches disclosed in International Patent Application Number PCT/US2012/038693, cited above.

In many instances, a fundamental MEJ includes a ferromagnetic fixed layer, a ferromagnetic free layer, and a dielectric layer interposed between said ferromagnetic fixed layer and ferromagnetic free layer. The ferromagnetic fixed layer generally has a fixed magnetization direction, whereas the ferromagnetic free layer can adopt a magnetization direction that is either substantially parallel with or antiparallel with the ferromagnetic fixed magnetization direction. In many instances, the application of a potential difference across the MEJ invokes VCMA phenomena and thereby allows the free layer to be more easily 'switched' in a desired direction (i.e. the direction of magnetization can be defined as desired, e.g. either substantially parallel with or antiparallel with the magnetization of the fixed layer); thus, the free layer can adopt a magnetization direction either parallel with or antiparallel with the magnetization direction of the fixed magnet. In accordance with tunnel magnetoresistance ("TMR") principles, the resistance of the MEJ will vary depending upon whether the free layer adopts a parallel or an antiparallel magnetization direction relative to the fixed layer, and therefore, the MEJ can define two information states (i.e. one bit of information). An MEJ can thereby be 'read,' i.e. whether its ferromagnetic layers have magnetization directions that are parallel or antiparallel can be determined by measuring the resistance across it. Thus, it can be seen that generally, VCMA phenomena can be used to facilitate 'writing' to an MEJ, while TMR effects are implicated in the 'reading' of the bit.

While MEJs demonstrate much promise, their potential applications continue to be explored. For example, U.S. Pat. No. 8,841,739 (the '739 patent) to Khalili Amiri et al. discloses DIOMEJ cells that utilize diodes (e.g. as opposed to transistors) as access devices to MEJs. As discussed in the '739 patent, using diodes as access devices for MEJs can confer a number of advantages and thereby make the implementation of MEJs much more practicable. The disclosure of the '739 patent is hereby incorporated by reference in its entirety, especially as it pertains to implementing diodes as access devices for MEJs. Furthermore, U.S. Pat. No. 9,099,641 ("the '641 patent") to Khalili Amiri et al. discloses MEJ configurations that demonstrate improved writability and readability, and further make the implementation of MEJs more practicable. The disclosure of the '641 patent is hereby incorporated by reference in its entirety, especially as it pertains to MEJ configurations that demonstrate improved writability and readability. Additionally, U.S. patent application Ser. No. 14/681,358 ("the '358 patent application") to Qi Hu discloses implementing MEJ configurations that incorporate piezoelectric materials to strain the respective MEJs during operation, and thereby improve performance. The disclosure of the '358 patent application is hereby incorporated by reference in its entirety, especially as it pertains to MEJ configurations that incorporate elements configured to strain the respective MEJs during operation, and thereby improve performance.

While much progress has been made with respect to the development of MEJ configurations, their full potential has yet to be explored. For example, conventional MEJ structures still heavily rely on the implementation of a specific subset of materials (e.g. Tantalum, Ruthenium, Platinum, or Palladium). However, the instant application discloses that by implementing certain unconventional materials combinations within MEJ structures, the performance of the respective MEJs can be substantially improved in a number of respects. For example, by incorporating, e.g. Hafnium, Molybdenum, Tungsten, Iridium, Bismuth, Rhenium, Gold, their combinations, or their combinations with conventional materials into respective seed/cap materials of MEJs, MEJs can be made to demonstrate: relatively strong perpendicular magnetic anisotropy (PMA) characteristics, e.g. even after the MEJ has undergone conventional manufacturing annealing processes; large tunneling magneto-resistance (TMR) phenomena, e.g. again, even after the MEJ has undergone conventional manufacturing annealing processes; and/or strong voltage-controlled magnetic anisotropy (VCMA) phenomena. In effect, more robust and efficient MEJs can be realized. Such configurations will be described in greater detail below. But first, fundamental MEJ structures and their operating principles are now discussed in greater detail.

Fundamental Magnetoelectric Junction Structures

A fundamental MEJ structure typically includes a ferromagnetic (FM) fixed layer, a FM free layer that has a uniaxial anisotropy (for simplicity, the terms "FM fixed layer" and "fixed layer" will be considered equivalent throughout this application, unless otherwise stated; similarly, the terms "FM free layer", "ferromagnetic free layer," "free layer that has a uniaxial anisotropy", and "free layer" will also be considered equivalent throughout this application, unless otherwise stated), and a dielectric layer separating the FM fixed layer and FM free layer. Generally, the FM fixed layer has a fixed magnetization direction, i.e. the direction of magnetization of the FM fixed layer does not change during the normal operation of the MEJ. Conversely, the FM free layer can adopt a magnetization direction that is either substantially parallel with or antiparallel with the FM fixed layer, i.e. during the normal operation of the MEJ, the direction of magnetization can be made to change. For example, the FM free layer may have a magnetic uniaxial anisotropy, whereby it has an easy axis that is substantially aligned with the direction of magnetization of the FM fixed layer. The easy axis refers to the axis, along which the magnetization direction of the layer prefers to align. In other words, an easy axis is an energetically favorable direction (axis) of spontaneous magnetization that is determined by various sources of magnetic anisotropy including, but not limited to, magnetocrystalline anisotropy, magnetoelastic anisotropy, geometric shape of the layer, etc. Relatedly, an easy plane is a plane whereby the direction of magnetization is favored to be within the plane, although there is no bias toward a particular axis within the plane. The easy axis and the direction of the magnetization of the fixed layer can be considered to be 'substantially aligned' when—in the case where the magnetization direction of the free layer conforms to the easy axis—the underlying principles of magnetoresistance take effect and result in a distinct measurable difference in the resistance of the MEJ as between when the magnetization directions of the FM layers are substantially parallel relative to when they are substantially antiparallel, e.g. such that two distinct information states can be defined. Similarly, the magnetization directions of the fixed layer and the free layer can be considered to be substantially parallel/antiparallel when the underlying principles of magnetoresistance take effect and result in a distinct measurable difference in the resistance of the MEJ as between the two states (i.e. substantially parallel and substantially antiparallel).

VCMA phenomena can be relied on in switching the FM free layer's characteristic magnetization direction, i.e. the MEJ can be configured such that the application of a potential difference across the MEJ can reduce the coercivity of the free layer, which can allow the free layer's magnetization direction to be switched more easily. For example, with a reduced coercivity, the FM free layer can be subject to magnetization that can make it substantially parallel with or substantially antiparallel with the direction of the magnetization for the FM fixed layer. A more involved discussion regarding the general operating principles of an MEJ is presented in the following section.

Notably, the magnetization direction, and the related characteristics of magnetic anisotropy, can be established for the FM fixed and FM free layers using any suitable method. For instance, the shapes of the constituent FM fixed layer, FM free layer, and dielectric layer, can be selected based on desired magnetization direction orientations. For example, implementing FM fixed, FM free, and dielectric layers that have an elongated shape, e.g. have an elliptical cross-section, may tend to induce magnetic anisotropy that is in the direction of the length of the elongated axis—i.e. the FM fixed and FM free layers will possess a tendency to adopt a direction of magnetization along the length of the elongated axis. In other words, the direction of the magnetization is 'in-plane'. Alternatively, where it is desired that the magnetic anisotropy have a directional component that is perpendicular to the FM fixed and FM free layers (i.e., 'out-of-plane'), the shape of the layers can be made to be symmetrical, e.g. circular, and further the FM layers can be made to be thin. In this case, while the tendency of the magnetization to remain in-plane may still exist, it may not have a preferred directionality within the plane of the layer. Because the FM layers are relatively thinner, the anisotropic effects that result from interfaces between the FM layers and any adjacent layers, which tend to be out-of-plane, may tend to dominate the overall anisotropy of the FM layer. Alternatively, a material may be used for the FM fixed or free layers which has a bulk perpendicular anisotropy, i.e. an anisotropy originating from its bulk (volume) rather than from its interfaces with other adjacent layers. The FM free or fixed layers may also consist of a number of sub-layers, with the interfacial anisotropy between individual sub-layers giving rise to an effective bulk anisotropy to the material as a whole. Additionally, FM free or fixed layers may be constructed which combine these effects, and for example have both interfacial and bulk contributions to perpendicular anisotropy. Of course, any suitable methods for imposing magnetic anisotropy can be implemented in accordance with many embodiments of the invention.

FIG. 1A illustrates an MEJ whereby the FM fixed layer and the FM free layer are separated by, and directly adjoined to, a dielectric layer. In particular, in the illustration, the MEJ 100 includes an FM fixed layer 102 that is adjoined to a dielectric layer 106, thereby forming a first interface 108; the MEJ further includes an FM free layer 104 that is adjoined to the dielectric layer 106 on an opposing side of the first interface 108, and thereby forms a second interface 110. The MEJ 100 has an FM fixed layer 102 that has a magnetization direction 112 that is in-plane, and depicted in the illustration as being from left to right. Accordingly, the FM free layer is configured such that it can adopt a magnetization direction 114 that is either parallel with or antiparallel with the magnetization direction of the FM fixed layer. For reference, the easy axis 116 is illustrated, as well as a parallel magnetization direction 118, and an antiparallel magnetization direction 120. Additional contacts (capping or seed materials, or multilayers of materials, not shown in FIG. 1A) may be attached to the FM free layer 104 and the FM fixed layer 102, thereby forming additional interfaces. Thus, FIG. 1B illustrates an MEJ and depicts the constituent cap/seed layers. The contacts can both contribute to the electrical and magnetic characteristics of the device by providing additional interfaces, and can also be used to apply a potential difference across the device. Additionally, it should of course be understood that MEJs can include metallic contacts that can allow them to interconnect with other electrical components.

Importantly, by appropriately selecting the materials, the MEJ can be configured such that the application of a potential difference across the FM fixed layer and the FM free layer can modify the magnetic anisotropy, and correspondingly reduce the coercivity, of the FM free layer. For example, whereas in FIG. 1A-1B, the magnetization direction of the FM free layer is depicted as being in-plane, the application of a voltage may distort the magnetization direction of the FM free layer such that it includes a component that is at least partially out of plane. The particular dynamics of the modification of the magnetic anisotropy will be discussed below in the section entitled "MEJ Operating Principles." Suitable materials for the FM layers such that this effect can be implemented include iron, nickel, manganese, cobalt, FeCoB, FeGaB, FePd, FePt; further, any compounds or alloys that include these materials may also be suitable. Suitable materials for the dielectric layer include $MgO$ and $Al_2O_3$. Of course, it should be understood that the material selection is not limited to those recited—any suitable FM material can be used for the FM fixed and free layers, and any suitable material can be used for the dielectric layer. It should also be understood that each of the FM free layer, FM fixed layer, and dielectric layer may consist of a number of sub-layers, which acting together provide the functionality of the respective layer.

Figure 2:
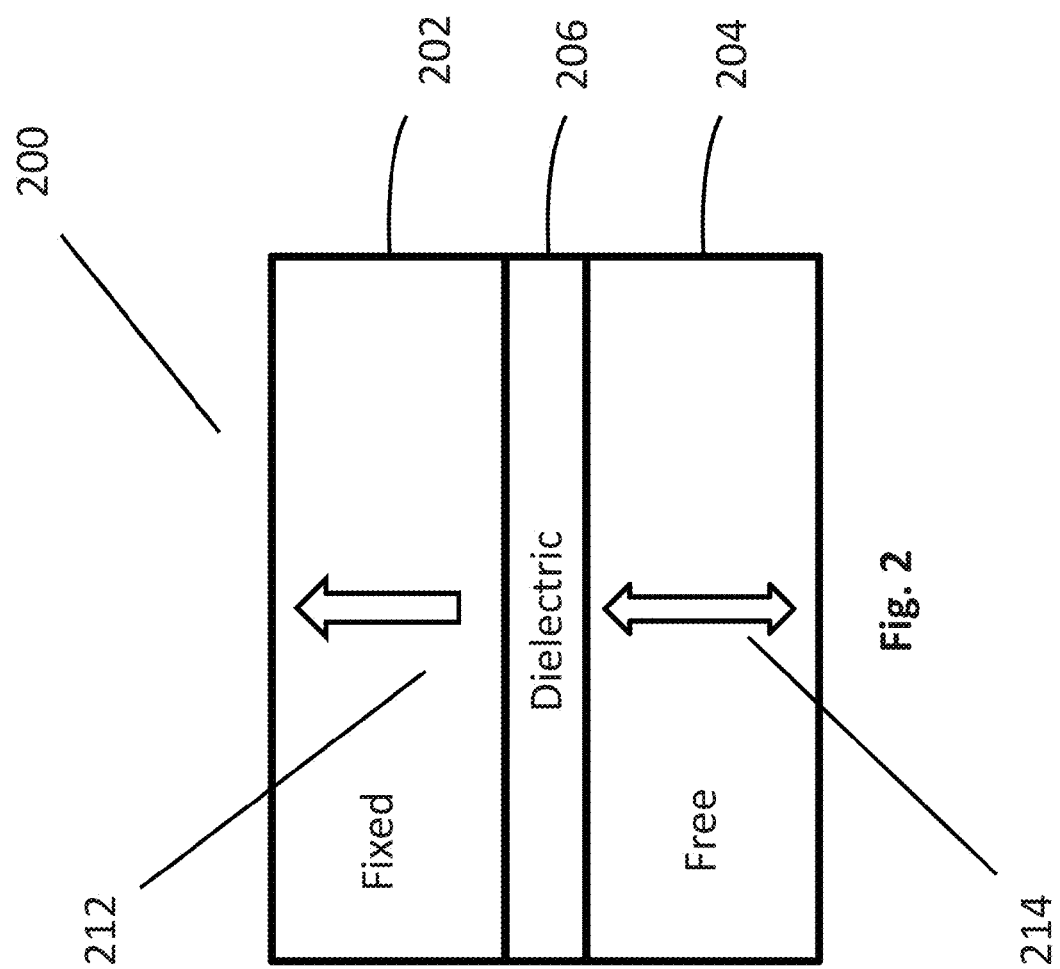
FIG. 2 illustrates an MEJ that includes out of plane magnetization in accordance with certain embodiments of the invention.

FIG. 2 illustrates an MEJ whereby the orientation of the magnetization directions is perpendicular to the plane of the constituent layers ("perpendicular magnetic anisotropy"). In particular, the MEJ 200 is similarly configured to that seen in FIG. 1, with an FM fixed layer 202 and an FM free layer 204 adjoined to a dielectric layer 206. However, unlike the MEJ in FIG. 1, the magnetization directions of the FM fixed and FM free layers, 212 and 214 respectively, are oriented perpendicularly to the layers of the MEJ. Additional contacts (capping or seed materials, or multilayers of materials, not shown) may be attached to the FM free layer 204 and the FM fixed layer 202, thereby forming additional interfaces. The contacts both contribute to the electrical and magnetic characteristics of the device by providing additional interfaces, and can also be used to apply a potential difference across the device. It should also be understood that each of the FM free layer, FM fixed layer, and dielectric layer may consist of a number of sub-layers, which acting together provide the functionality of the respective layer.

Of course, it should be understood that the direction of magnetization for the FM layers can be in any direction, as long as the FM free layer can adopt a direction of magnetization that is either substantially parallel with or antiparallel with the direction of magnetization of the FM fixed layer. For example, the direction of magnetization can include both in-plane and out-of-plane components.

In many instances, an MEJ includes additional adjunct layers that function to facilitate the operation of the MEJ. For example, in many instances, the FM free layer includes a capping or seed layer, which can (1) help induce greater electron spin perpendicular to the surface of the layer, thereby increasing its perpendicular magnetic anisotropy, and/or (2) can further enhance the sensitivity to the application of an electrical potential difference. In general, the seed/cap layers can beneficially promote the crystallinity of the ferromagnetic layers. The seed layer can also serve to separate a corresponding ferromagnetic layer from an 'underlayer.' As will be discussed below, in many embodiments of the invention, the capping/seed layer includes one of: Hf, Mo, W, Ir, Bi, Re, and/or Au; the listed elements can be incorporated by themselves, in combination with one another, or in combination with more conventional materials, such as Ta, Ru, Pt, Pd. As will be discussed in greater detail below, seed and/or cap layers made in this way can confer a number of benefits to the MEJ structure.

Figure 3:
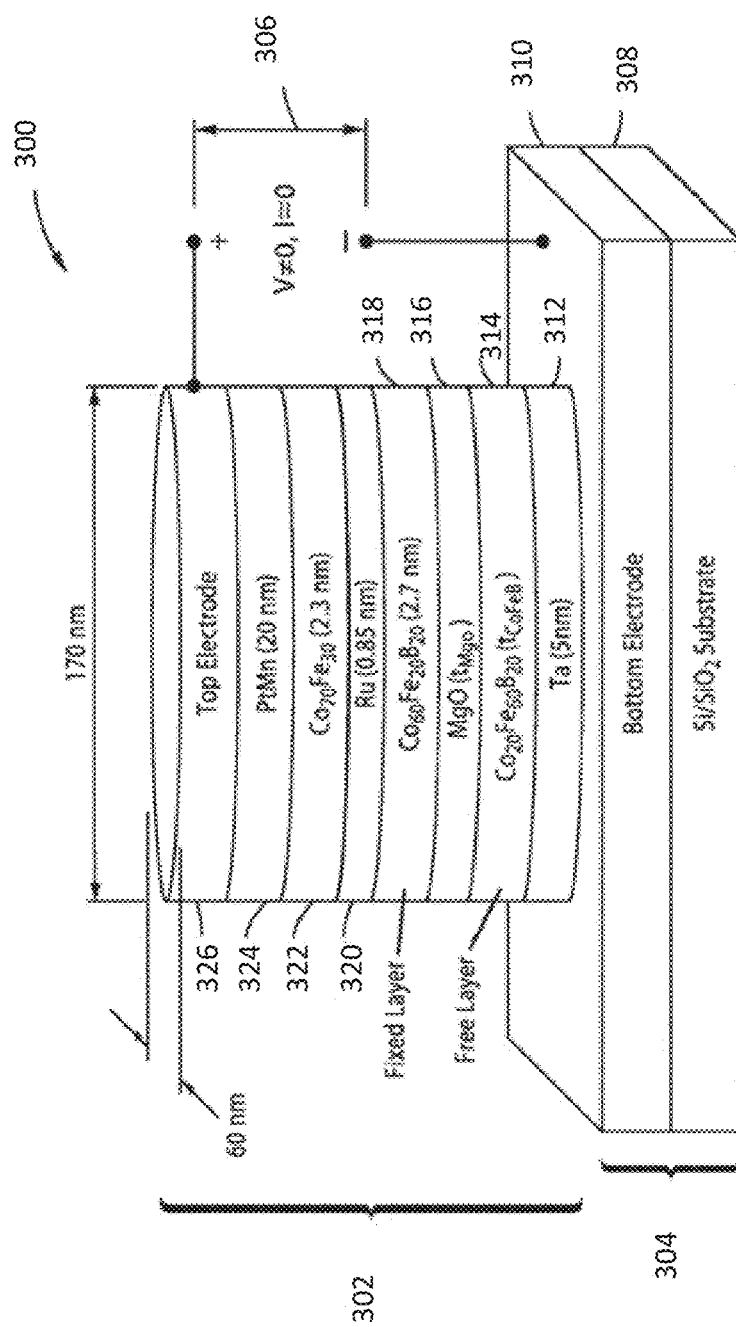
FIG. 3 illustrates an MEJ that includes adjunct layers to facilitate its operation.

FIG. 3 illustrates an MEJ 300 that includes multiple layers that work in aggregate to facilitate the functionality of the MEJ 300. A pillar section 302 extends from a planar section 304. A voltage is shown being applied 306 between the top and bottom of the pillar. By way of example, an Si/SiO$_2$ substrate 308 is seen over which is a bottom electrode 310. The pillar 302 comprises the following layers in order: Ta 312 (e.g., 5 nm in thickness); a free layer 314 comprising an Fe-rich CoFeB material (e.g. $Co_{20}Fe_{60}B_{20}$ having a thickness generally ranging from, but not limited to, 0.8 nm-1.6 nm); a dielectric layer 316 comprising a dielectric oxide such as MgO or $Al_2O_3$ having a thickness of approximately, but not limited to, 0.8-1.4 nm); a FM fixed layer 318 comprising a CoFeB material (e.g. $Co_{60}Fe_{20}B_{20}$ having a thickness of approximately, but not limited to, 2.7 nm); a metal layer (e.g. Ru 320 having a thickness of approximately, but not limited to, 0.85 nm) to provide antiferromagnetic inter-layer exchange coupling; an exchange-biased layer 322 of $Co_{70}Fe_{30}$ (e.g., thickness of approximately, but not limited to, 2.3 nm), the magnetization orientation of which is pinned by exchange bias using an anti-ferromagnetic layer 324, e.g. PtMn, IrMn, or a like material having a thickness of approximately, but not limited to, 20 nm); and a top electrode 326. By way of example and not limitation, the pillar of the device depicted is in the shape of a 170 nm×60 nm elliptical nanopillar. In this illustration, Ta layer 312 is used as a seed layer to help induce a larger magnitude of perpendicular magnetic anisotropy and/or enhance the electric-field sensitivity of magnetic properties (such as anisotropy) in the FM free layer. It also acts as a sink of B atoms during annealing of the material stack after deposition, resulting in better crystallization of the FM free layer and thereby increasing the TMR and/or VCMA effect. Of course any suitable materials can be used as a capping or seed layer 312; for example, as will be discussed in greater detail below, in many embodiments of the invention, the seed and/or cap layers include one of: Molybdenum, Tungsten, Hafnium, Iridium, Bismuth, Rhenium, and/or Gold. More generally, any adjunct layers that can help facilitate the proper functioning of the MEJ can be implemented in an MEJ.

MEJs can also include a semi-fixed layer which has a magnetic anisotropy that is altered by the application of a potential difference. In many instances the characteristic magnetic anisotropy of the semi-fixed layer is a function of the applied voltage. For example in many cases, the direction of the magnetization of the semi-fixed layer is oriented in the plane of the layer in the absence of a potential difference across the MEJ. However, when a potential difference is applied, the magnetic anisotropy is altered such that the magnetization includes a strengthened out-of-plane component. Moreover, the extent to which the magnetic anisotropy of the semi-fixed layer is modified as a function of applied voltage can be made to be less than the extent to which the magnetic anisotropy of the FM free layer is modified as a function of applied voltage. The incorporation of a semi-fixed layer can facilitate a more nuanced operation of the MEJ (to be discussed below in the section entitled "MEJ Operating Principles").

Figure 4A:
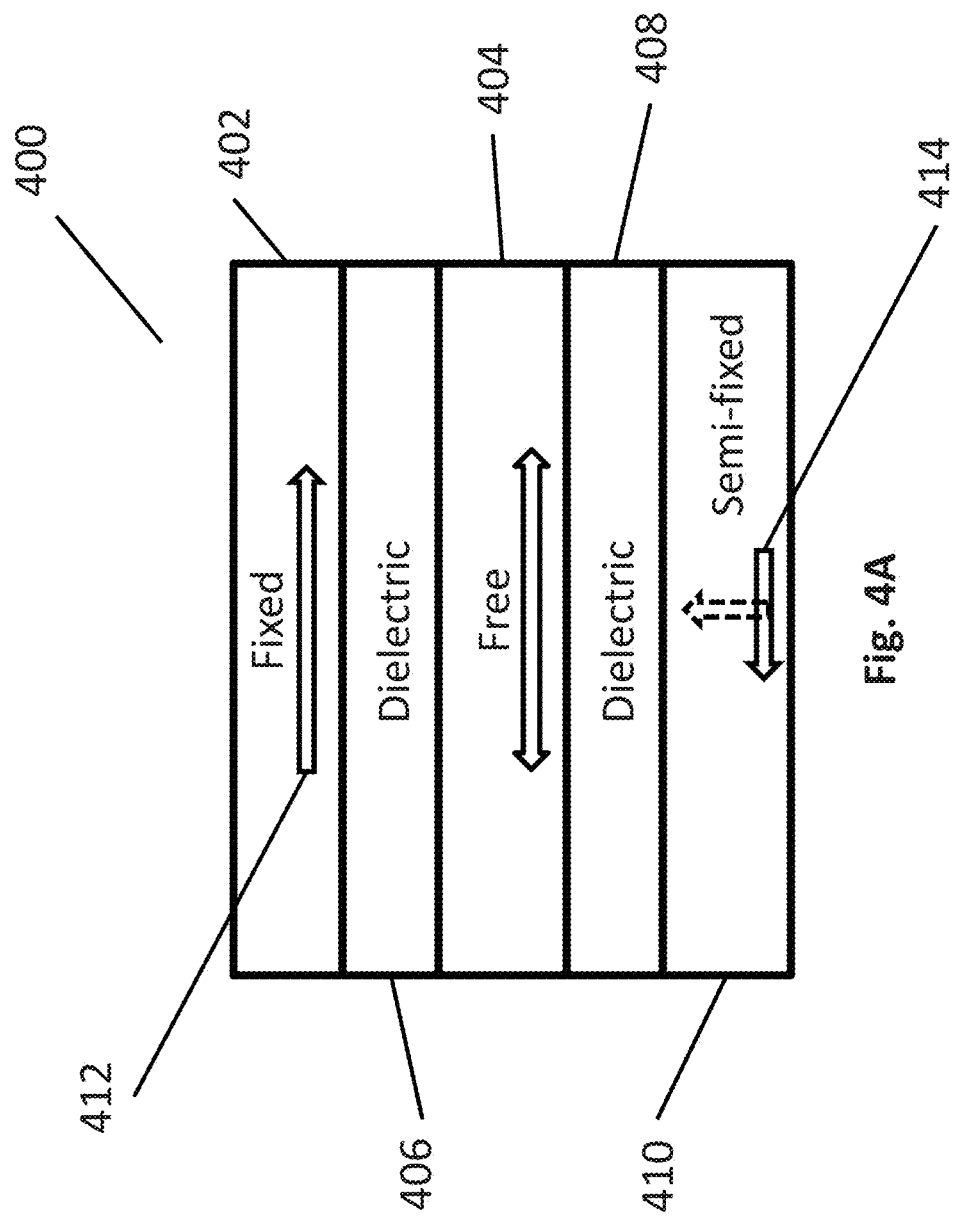

FIG. 4A illustrates an MEJ that includes a semi-fixed layer. In particular, the configuration of the MEJ 400 is similar to that depicted in FIG. 1, insofar as it includes an FM fixed layer 402 and an FM free layer 404 separated by a dielectric layer 406. However, the MEJ 400 further includes a second dielectric layer 408 adjoined to the FM free layer 404 such that the FM free layer is adjoined to two dielectric layers, 406 and 408 respectively, on opposing sides. Further, a semi-fixed layer 410 is adjoined to the dielectric layer. Typically, the direction of magnetization of the semi-fixed layer 414 is antiparallel with that of the FM fixed layer 412. As mentioned above, the direction of magnetization of the semi-fixed layer can be manipulated based on the application of a voltage. In the illustration, it is depicted that the application of a potential difference adjusts the magnetic anisotropy of the semi-fixed layer such that the strength of the magnetization along a direction orthogonal to the initial direction of magnetization (in this case, out of the plane of the layer) is developed. It should of course be noted that the application of a potential difference can augment the magnetic anisotropy in any number of ways; for instance, in some MEJs, the application of a potential difference can reduce the strength of the magnetization in a direction orthogonal to the initial direction of magnetization. Note also that in the illustration, the directions of magnetization are all depicted to be in-plane where there is no potential difference. However, of course it should be understood that the direction of the magnetization can be in any suitable direction. More generally, although a particular configuration of an MEJ that includes a semi-fixed layer is depicted, it should of course be understood that a semi-fixed layer can be incorporated within an MEJ in any number of configurations. For example, FIG. 4B illustrates an MEJ that includes a semi-fixed layer that is in a different configuration than that seen in 4A. In particular, the MEJ 450 is similar to that seen in FIG. 4A, except that the positioning of the semi-fixed layer 464 and the free layer 454 is inverted. In certain situations, such a configuration may be more desirable.

The general principles of the operation of an MEJ are now discussed.

General Principles of MEJ Operation

MEJ operating principles—as they are currently understood—are now discussed. Note that embodiments of the invention are not constrained to the particular realization of these phenomena. Rather, the presumed underlying physical phenomena is being presented to inform the reader as to how MEJs are believed to operate. MEJs generally function to achieve two distinct states using the principles of magnetoresistance. As mentioned above, magnetoresistance principles regard how the resistance of a thin film structure that includes alternating layers of ferromagnetic and non-magnetic layers depends upon whether the ferromagnetic layers are in a substantially parallel or antiparallel alignment. Thus, an MEJ can achieve a first state where its FM layers have magnetization directions that are substantially parallel, and a second state where its FM layers have magnetization directions that are substantially antiparallel. MEJs further rely on voltage-controlled magnetic anisotropy (VCMA) phenomena. Generally, VCMA phenomena regard how the application of a voltage to a ferromagnetic material that is adjoined to an adjacent dielectric layer can impact the characteristics of the ferromagnetic material's magnetic anisotropy. For example, it has been demonstrated that the interface of oxides such as MgO with metallic ferromagnets such as Fe, CoFe, and CoFeB can exhibit a large perpendicular magnetic anisotropy which is furthermore sensitive to voltages applied across the dielectric layer, an effect that has been attributed to spin-dependent charge screening, hybridization of atomic orbitals at the interface, and to the electric field induced modulation of the relative occupancy of atomic orbitals at the interface. MEJs can exploit this phenomenon to achieve two distinct states. For example, MEJs can employ one of two mechanisms to do so: first, MEJs can be configured such that the application of a potential difference across the MEJ functions to reduce the coercivity of the FM free layer, such that it can be subject to magnetization in a desired magnetic direction, e.g. either substantially parallel with or antiparallel with the magnetization direction of the fixed layer; second, MEJ operation can rely on precessional switching (or resonant switching), whereby by precisely subjecting the MEJ to voltage pulses of precise duration, the direction of magnetization of the FM free layer can be made to switch.

In many instances, MEJ operation is based on reducing the coercivity of the FM free layer such that it can adopt a desired magnetization direction. With a reduced coercivity, the FM free layer can adopt a magnetization direction in any suitable way. For instance, the magnetization can result from: an externally applied magnetic field, the magnetic field of the FM fixed layer; the application of a spin-transfer torque (STT) current; the magnetic field of a FM semi-fixed layer; the application of a current in an adjacent metal line inducing a spin-orbit torque (SOT); and any combination of these mechanisms, or any other suitable method of magnetizing the FM free layer with a reduced coercivity.

By way of example and not limitation, examples of suitable ranges for the externally applied magnetic field are in the range of 0 to 100 Oe. The magnitude of the electric field applied across the device to reduce its coercivity or bring about resonant switching can be approximately in the range of 0.1-2.0 V/nm, with lower electric fields required for materials combinations that exhibit a larger VCMA effect. The magnitude of the STT current used to assist the switching may be in the range of approximately 0.1-1.0 $MA/cm^2$.

FIG. 5A depicts how the application of a potential difference can reduce the coercivity of the free layer such that an externally applied magnetic field H can impose a magnetization switching on the free layer. In the illustration, in step 1, the FM free layer and the FM fixed layer have a magnetization direction that is substantially in plane; the FM free layer has a magnetization direction that is parallel with that of the FM fixed layer. Further, in Step 1, the coercivity of the FM free layer is such that the FM free layer is not prone to having its magnetization direction reversed by the magnetic field H, which is in a direction antiparallel with the magnetization direction of the FM fixed layer. However, a Voltage, $V_c$ is then applied, which results in step 2, where the voltage $V_c$ has magnified the perpendicular magnetization direction component of the free layer (out of its plane). Correspondingly, the coercivity of the FM free layer is reduced such that it is subject to magnetization by an in-plane magnetic field H. Accordingly, when the potential difference $V_c$ is removed, VCMA effects are removed and the magnetic field H, which is substantially anti-parallel to the magnetization direction of the FM fixed layer, causes the FM free layer to adopt a direction of magnetization that is antiparallel with the magnetization direction of the FM fixed layer. Hence, as the MEJ now includes an FM fixed layer and an FM free layer that have magnetization directions that are antiparallel, it reads out a second information state (resistance value) different from the first. In general, it should be understood that in many embodiments where the magnetization directions of the free layer and the fixed layer are substantially in-plane, the application of a voltage enhances the perpendicular magnetic anisotropy such that the FM free layer can be caused to adopt an out-of-plane direction of magnetization. Stated differently, the magnetoelectric junction is configured such that when a potential difference is applied across the magnetoelectric junction, the magnetic anisotropy of the ferromagnetic free layer is altered such that the relative strength of the magnetic anisotropy along a second easy axis that is orthogonal to the first easy axis (which corresponds to the magnetization direction of the fixed layer), or the easy plane where there is no easy axis that is orthogonal to the first easy axis, as compared to the strength of the magnetic anisotropy along the first easy axis, is magnified or reduced for the duration of the application of the potential difference. The magnetization direction can thereby be made to switch. In general, it can be seen that by controlling the potential difference and the direction of an applied external magnetic field, an MEJ switch can be achieved.

It should of course be understood that the direction of the FM fixed layer's magnetization direction need not be in-plane—it can be in any suitable direction. For instance, it can be substantially out of plane. Additionally, the FM free layer can include both in-plane and out-of-plane magnetic anisotropy directional components. FIG. 5B depicts a corresponding case relative to FIG. 5A when the FM fixed and FM free layers have magnetization directions that are perpendicular to the layers of the MEJ (out-of-plane). It is of course important, that an FM, magnetically anisotropic, free layer be able to adopt a magnetization direction that is either substantially parallel with an FM fixed layer, or substantially antiparallel with an FM fixed layer. In other words, when unburdened by a potential difference, the FM free layer can adopt a direction of magnetization that is either substantially parallel with or antiparallel with the direction of the FM fixed layer's magnetization, to the extent that a distinct measurable difference in the resistance of the MEJ that results from the principles of magnetoresistance as between the two states (i.e. parallel alignment vs. antiparallel alignment) can be measured, such that two distinct information states can be defined.

Note of course that the application of an externally applied magnetic field is not the only way for the MEJ to take advantage of reduced coercivity upon application of a potential difference. For example, the magnetization of the FM fixed layer can be used to impose a magnetization direction on the free layer when the free layer has a reduced coercivity. Moreover, an MEJ can be configured to receive a spin-transfer torque (STT) current when application of a voltage causes a reduction in the coercivity of the FM free layer. Generally, STT current is a spin-polarized current that can be used to facilitate the change of magnetization direction on a ferromagnetic layer. It can originate, for example, from a current passed directly through the MEJ device, such as due to leakage when a voltage is applied, or it can be created by other means, such as by spin-orbit-torques (e.g., Rashba or Spin-Hall Effects) when a current is passed along a metal line placed adjacent to the FM free layer. Accordingly, the spin orbit torque current can then help cause the FM free layer to adopt a particular magnetization direction, where the direction of the spin orbit torque determines the direction of magnetization. This configuration is advantageous over conventional STT-RAM configurations since the reduced coercivity of the FM free layer reduces the amount of current required to cause the FM free layer to adopt a particular magnetization direction, thereby making the device more energy efficient.

Figure 6:
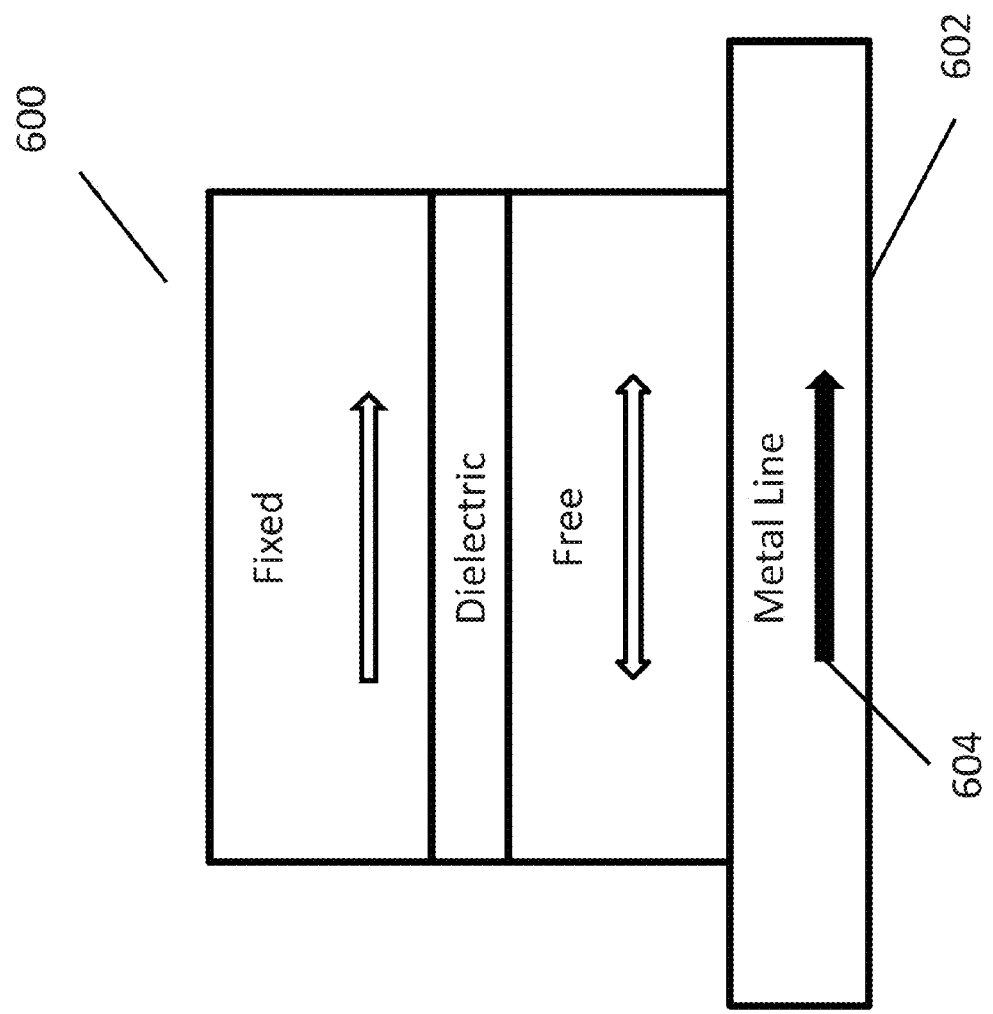
FIG. 6 illustrates an MEJ having a metal line parallel to and proximate the free layer where current can pass through the metal line and thereby induce spin-orbit torques that can cause the ferromagnetic free layer to adopt a particular magnetization direction in accordance with certain embodiments of the invention.

FIG. 6 depicts using a metal line disposed adjacent to an FM free layer to generate spin-orbit torques that can impose a magnetization direction change on the FM free layer. In particular, the MEJ 600 is similar to that seen in FIG. 1, except that it further includes a metal line 602, whereby a current 604 can flow to induce spin-orbit torques, which can thereby help impose a magnetization direction change on the ferromagnetic free layer.

Additionally, in many instances, an MEJ cell can further take advantage of thermally assisted switching (TAS) principles. Generally, in accordance with TAS principles, heating up the MEJ during a writing process reduces the magnetic field required to induce switching. Thus, for instance, where STT is employed, even less current may be required to help impose a magnetization direction change on a free layer, particularly where VCMA principles have been utilized to reduce its coercivity.

Moreover, the switching of MEJs to achieve two information states can also be achieved using voltage pulses. In particular, if voltage pulses are imposed on the MEJ for a time period that is one-half of the precession of the magnetization of the free layer, then the magnetization may invert its direction. Using this technique, ultrafast switching times, e.g. below 1 ns, can be realized; moreover, using voltage pulses as opposed to a current, makes this technique more energetically efficient as compared to the precessional switching induced by STT currents, as is often used in STT-RAM. However, this technique is subject to the application of a precise pulse that is half the length of the precessional period of the magnetization layer. For instance, it has been observed that pulse durations in the range of 0.05 to 3 nanoseconds can reverse the magnetization direction. Additionally, the voltage pulse must be of suitable amplitude to cause the desired effect, e.g. reverse the direction of magnetization.

Based on this background, it can be seen that MEJs can confer numerous advantages relative to conventional MTJs. For example, they can be controlled using voltages of a single polarity—indeed, the '739 patent, incorporated by reference above, discusses using diodes, in lieu of transistors, as access devices to the MEJ, and this configuration is enabled because MEJs can be controlled using voltage sources of a single polarity.

Figure 7:
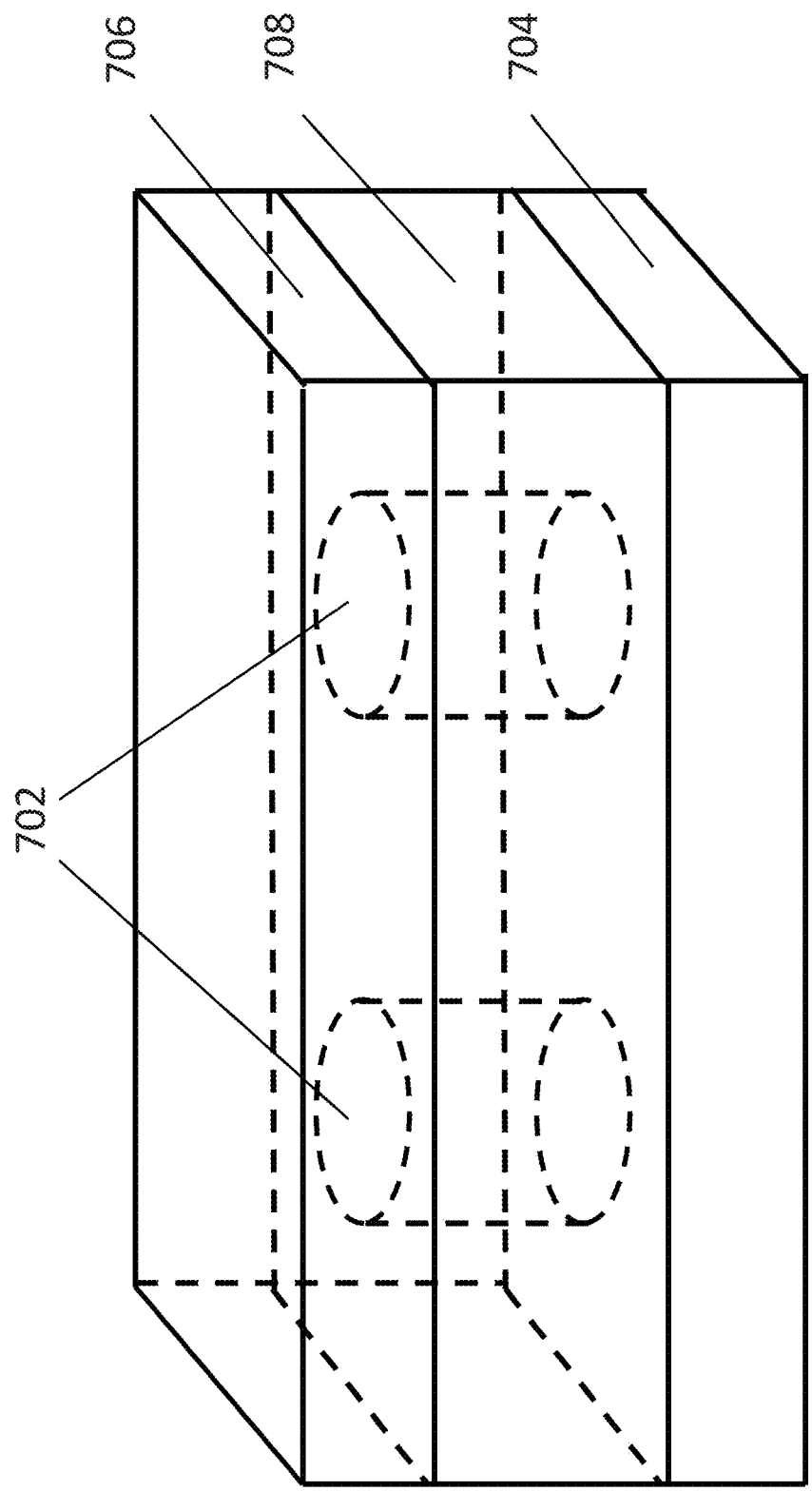
FIG. 7 illustrates the implementation of a plurality of MEJs in accordance with certain embodiments of the invention.

Note that while the above discussion largely regards the operation of single MEJs, it should of course be understood that in many instances, a plurality of MEJs are implemented together. For example, the '671 patent application discloses MeRAM configurations that include a plurality of MEJs disposed in a cross-bar architecture. It should be clear that MEJ systems can include a plurality of MEJs in accordance with embodiments of the invention. Where multiple MEJs are implemented, they can be separated by field insulation, and encapsulated by top and bottom layers. Thus, for example, FIG. 7 depicts the implementation of two MEJs that are housed within encapsulating layers and separated by field insulation. In particular, the MEJs 702 are encapsulated within a bottom layer 704 and a top layer 706. Field insulation 708 is implemented to isolate the MEJs and facilitate their respective operation. It should of course be appreciated that each of the top and bottom layers can include one or multiple layers of materials/structures. As can also be appreciated, the field insulation material can be any suitable material that functions to facilitate the operation of the MEJs in accordance with embodiments of the invention. While a certain configuration for the implementation of a plurality of MEJs has been illustrated and discussed, any suitable configuration that integrates a plurality of MEJs can be implemented in accordance with embodiments of the invention.

Particularly effective materials combinations for implementing MEJs are now discussed below.

Particularly Effective Materials Combinations for MEJs

As alluded to above, in many embodiments, particularly robust and efficient MEJs are achieved by incorporating specific materials within the MEJ. For example, in many embodiments, the cap and/or seed layer of an MEJ includes one of: Hafnium, Molybdenum, Tungsten, Iridium, Bismuth, Rhenium, and/or Gold. In many embodiments, the cap and/or seed layer of an MEJ includes one of: Molybdenum, Tungsten, Iridium, Bismuth, Rhenium, and/or Gold. In a number of embodiments, the cap and/or seed layer of an MEJ includes one of: Molybdenum, Iridium, Bismuth, Rhenium, and/or Gold. Note that the seed and/or cap material of any suitable MEJ can include the above-cited materials; for example, the listed materials can be implemented in the seed and/or cap layers corresponding to the MEJs disclosed in International Patent Application Number PCT/US2012/038693, the '739 patent, the 641 patent, and the '358 patent application, incorporated by reference above. These materials can be implemented by themselves, in combination with one another, or in combination with more conventional materials such as Tantalum, Ruthenium, Platinum, and Palladium. Certain such materials combinations can give rise to improved performance characteristics relative to MEJs having seed and/or cap layers made exclusively from conventional materials (e.g. Tantalum, Ruthenium, Platinum, or Palladium). For example, the implementation of such materials can provide MEJs with relatively strong perpendicular magnetic anisotropy (PMA). In particular, whereas MEJs that incorporate seed and/or cap layers that are made exclusively from conventional materials tend to lose their perpendicular magnetic anisotropy to some extent during manufacturing processes—e.g. annealing at 450° C.—MEJs that include seed and/or cap layers that include one of Hafnium, Molybdenum, Tungsten, Iridium, Bismuth, Rhenium, and/or Gold may not be as prone to having their perpendicular magnetic anisotropy as detrimentally impacted. In this way, such MEJs can be more thermally robust as compared to conventional MEJs insofar as they can withstand exposure to higher temperatures with reduced detrimental impact.

In many instances, MEJs that include seed and/or cap layers that include one of the aforementioned materials are characterized by relatively strong tunneling magnetoresistance characteristics relative to conventional MEJs. Similar to before, whereas MEJs that include seed and/or cap layers that exclusively utilize conventional materials tend to lose their tunneling magnetoresistance to some extent during manufacturing processes—e.g. annealing at 450° C.—MEJs that include seed and/or cap layers that include one of the aforementioned materials may not be as prone to having their tunneling magnetoresistance as detrimentally impacted when exposed to higher temperatures. Accordingly, by fabricating an MEJ from some combination of the aforementioned materials, the MEJ can be made to possess relatively large—thermally robust—tunneling magnetoresistance characteristics. Recall from the discussion above that tunnel magnetoresistance phenomena is largely responsible for an MEJ's ability to define two information states.

In many instances, fabricating MEJs from such materials can allow for the MEJ to demonstrate a relatively large response with respect to VCMA phenomena. In other words, the application of a potential difference across an MEJ that incorporates the aforementioned materials can have a greater impact on the coercivity relative to when conventional materials are used. Consequently, the magnetization of the ferromagnetic free layer can be made to be more readily changeable. As before, this can enable the realization of a more robust MEJ. For example, where a current is used to establish the direction of magnetization of the ferromagnetic free layer, a relatively smaller current may be used cause the switching (e.g. relative to the current generally required to implement the switching for an MEJ that only utilizes conventional materials). It is believed that the stronger VCMA response of MEJs that incorporate the listed materials as seed and/or cap layers is also their overall thermal resilience. In other words, whereas higher temperatures can degrade the VCMA characteristics of MEJs that incorporate seed and/or cap layers characterized exclusively by conventional materials, MEJs that incorporate combinations of the listed materials as seed and/or cap layers can be less detrimentally impacted (with respect to their VCMA characteristics).

In many embodiments, materials combinations are implemented within an MEJ that can cause one or more of the three above-recited advantages. In numerous embodiments, materials combinations are implemented that result in at least two of the three above-recited advantages. In a number of embodiments, materials combinations are implemented that result in the realization of MEJs that demonstrate all three of the above-recited advantages. Importantly, any suitable materials combinations can be implemented within the seed and/or cap layer of an MEJ that result in at least one of the above-cited advantages in accordance with embodiments of the invention. For example, the following materials can be implemented within an MEJ to cause at least one of the above cited advantages: Hf, Mo, W, Ir, Bi, Re, and/or Au. Importantly, any suitable combination of the above-cited elements can be implemented within a seed and/or cap layer, such as e.g. Mo/W, Mo/Ir, Mo/Be, Mo/Au, Mo/Ir/Bi, Mo/Re/Au, etc. Moreover, in many embodiments, the listed elements are implemented in combination with more conventional materials. For example, in many embodiments, a seed layer includes one of: Mo/W/Ta; Mo/W/Ru; Mo/W/Pt; Mo/W/Pd; etc. To be clear, any suitable materials combination can be implemented that results in an MEJ that possesses at least one of the above-recited advantages.

Figure 8:
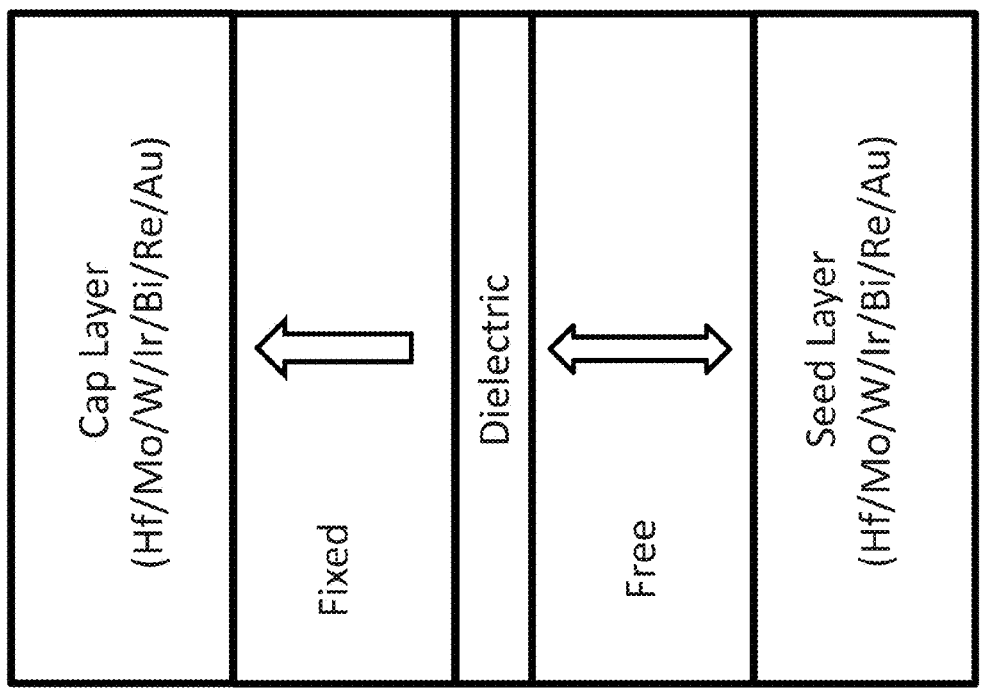
FIG. 8 illustrates an MEJ including seed and cap layers that include Hafnium, Molybdenum, Tungsten, Iridium, Bismuth, Rhenium, and/or Gold in accordance with certain embodiments of the invention.

Note that the aforementioned materials can be implemented within the seed and/or cap layers of MEJs in any suitable way in accordance with embodiments of the invention. As one example, FIG. 8 depicts an MEJ that incorporates Hafnium, Molybdenum, Tungsten, Iridium, Bismuth, Rhenium, and/or Gold in the seed and/or cap layer in accordance with certain embodiments of the invention. In particular, FIG. 8 is similar to FIG. 2 insofar as it depicts an MEJ. However, FIG. 8 further depicts the MEJ includes seed and cap layers, where the seed and cap layers include some combination of Hafnium, Molybdenum, Tungsten, Iridium, Bismuth, Rhenium, and/or Gold in accordance with certain embodiments of the invention. Of course, while a particular configuration is depicted in FIG. 8, various materials combinations can be implemented in any suitable way that results in the manifestation of at least some of the above-recited advantages in accordance with certain embodiments of the invention. For instance, as mentioned above, the listed materials can be incorporated in conjunction with more conventional materials in accordance with many embodiments.

Notably, the described MEJs can be fabricated in any suitable way in accordance with embodiments of the invention. For example, they can be fabricated using conventional layer-by-layer deposition techniques, such as those discussed in the '739 patent, the '641 patent, or the '358 application. For instance, the various constituent layers can be deposited via chemical vapor deposition, physical vapor deposition, (in particular such as radio-frequency sputtering, and/or DC sputtering). As can be appreciated, the deposited layers can be planarized after their respective deposition, e.g. via chemical-mechanical polishing. They can be deposited in any suitable thickness, e.g. between approximately 0.1 nm and approximately 10 nm. In many instances, the manufacturing processes can include annealing some or all of the layers. In numerous instances, the manufacturing process includes annealing the seed layer at a temperature in the range between 200° C. and 450° C. for a period of time between 1 minute to 60 minutes; the subsequent layers can thereafter be deposited. In some instances, after the various constituent layers have been deposited, the entire stack is thereafter annealed at a temperature between 200° C. and 450° C. for a period of time between 1 minute to 60 minutes. Of course, to be clear, while certain manufacturing techniques have been mentioned, the described robust MEJ configurations disclosed herein can be fabricated in any suitable way in accordance with embodiments of the invention.

Figure 9A:
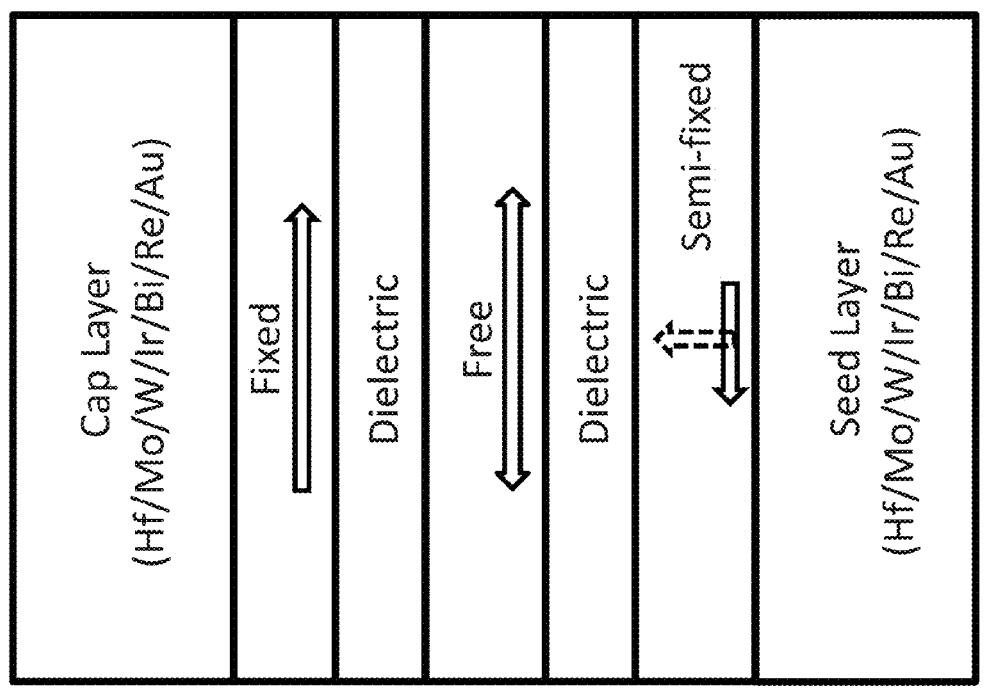
FIGS. 9A-9B illustrate MEJs that include semi-fixed layers that include seed/cap layers including Hafnium, Molybdenum, Tungsten, Iridium, Bismuth, Rhenium, and/or Gold in accordance with certain embodiments of the invention.
Figure 9B:
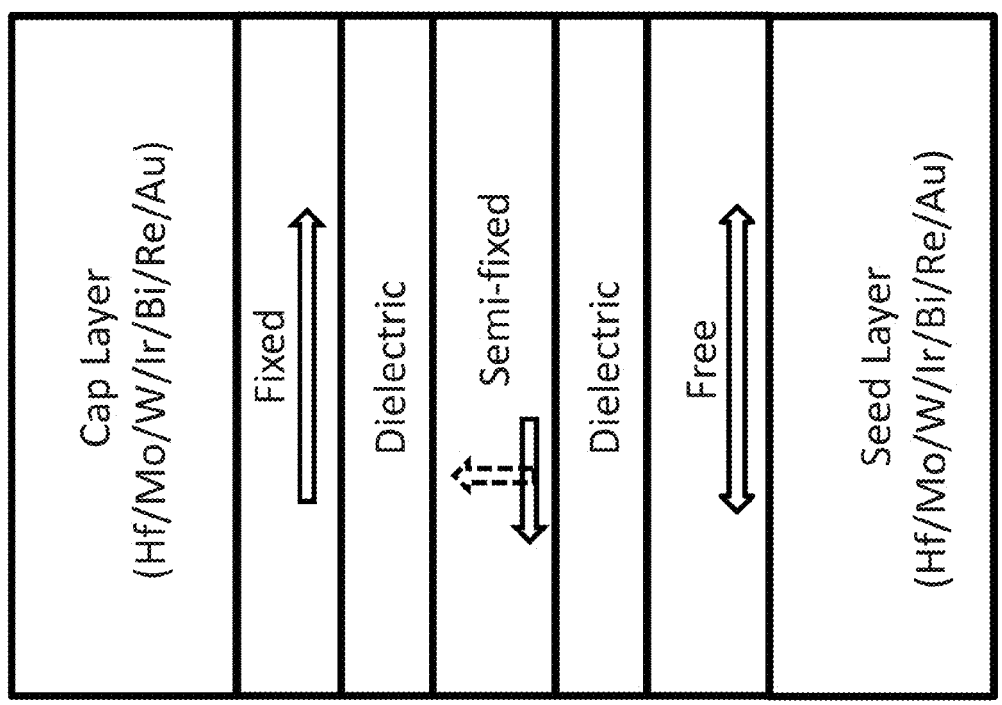
Figure 10:
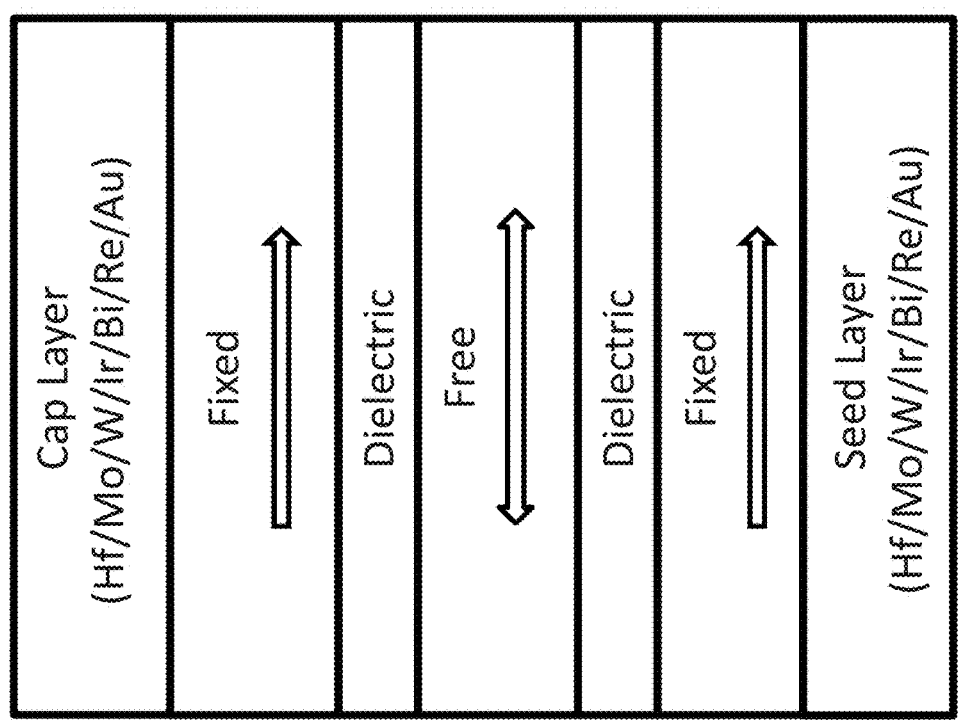
FIG. 10 illustrates an MEJ that includes two dielectric layers and two fixed layers, and includes seed/cap layers including Hafnium, Molybdenum, Tungsten, Iridium, Bismuth, Rhenium, and/or Gold in accordance with certain embodiments of the invention.

Additionally, while robust MEJ structures have been depicted with respect to certain fundamental configurations, it should be clear that the disclosed improvements can be implemented in any of a variety of ways in accordance with many embodiments of the invention. For example, they can be implemented with respect to the configurations disclosed in the '739 patent, the configurations disclosed in the '641 patent, and the MEJ systems that incorporate piezoelectric materials disclosed in the '358 application. It should be clear that the above examples are meant to be illustrative and not exhaustive. Thus, for example, FIGS. 9A-9B illustrate MEJs that include semi-fixed layers, as well as seed/cap layers that include combinations of Hafnium, Molybdenum, Tungsten, Iridium, Bismuth, Rhenium, and/or Gold in accordance with certain embodiments of the invention. In particular, FIGS. 9A-9B are similar to FIGS. 4A-4B, except that they further depict that the MEJs include seed layers that include combinations of the aforementioned materials. Similarly, FIG. 10 illustrates an MEJ that includes two dielectric layers and two fixed layers, and also includes seed/cap layers that include some combination of the aforementioned materials. As mentioned previously, the '641 patent describes MEJ configurations that include multiple dielectric layers and/or multiple ferromagnetic fixed layers. In general, it can be seen that the disclosed configurations can be implemented in any of a variety of MEJ structures. Embodiments of the invention are not limited to only specific MEJ configurations.

More generally, while certain features of the systems and methods have been illustrated and described herein, modifications, substitutions, changes and equivalents will occur to those skilled in the art. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described. For example, the MEJs discussed may be modified, but still consistent with the principles described herein.

What is claimed is:

1. A magnetoelectric junction comprising:
   a first ferromagnetic fixed layer;
   a ferromagnetic free layer that is magnetically anisotropic;
   a seed layer;
   a cap layer; and a dielectric layer that is disposed between the first ferromagnetic fixed layer and the ferromagnetic free layer;

wherein:

one of the seed layer and the cap layer is disposed adjacently to a ferromagnetic layer;

the first ferromagnetic fixed layer is magnetized in a first direction;

the ferromagnetic free layer can adopt a magnetization direction that is either substantially parallel with or substantially antiparallel with the first direction;

when a potential difference is applied across the aggregate of the cap layer, the first ferromagnetic fixed layer, the dielectric layer, the ferromagnetic free layer, and the seed layer, the coercivity of the ferromagnetic free layer is reduced for the duration of the application of the potential difference;

the reduction of the coercivity of the ferromagnetic free layer is enhanced by the use of voltage-controlled magnetic anisotropy; and at least one of the seed layer and the cap layer comprises one of: Iridium, Rhenium, and Gold.

2. The magnetoelectric junction of claim 1, wherein the magnetoelectric junction is configured such that it demonstrates stronger perpendicular magnetic anisotropy relative to a magnetoelectric junction that is identical except that its seed and cap layers do not include any of: Iridium, Rhenium, and Gold.

3. The magnetoelectric junction of claim 1, wherein the magnetoelectric junction is configured such that it demonstrates stronger tunnel magnetoresistance characteristics relative to a magnetoelectric junction that is identical except that its seed and cap layers do not include any of: Iridium, Bismuth, Rhenium, and Gold.

4. The magnetoelectric junction of claim 1, wherein the magnetoelectric junction is configured such that it demonstrates stronger voltage controlled magnetic anisotropy response relative to a magnetoelectric junction that is identical except that its seed and cap layers do not include any of: Iridium, Bismuth, Rhenium, and Gold.

5. The magnetoelectric junction of claim 1, wherein the magnetoelectric junction is configured such that it demonstrates stronger perpendicular magnetic anisotropy, stronger tunnel magnetoresistance characteristics, and a stronger voltage controlled magnetic anisotropy response, relative to a magnetoelectric junction that is identical except that its seed and cap layers do not include any of: Iridium, Bismuth, Rhenium, and Gold.

6. The magnetoelectric junction of claim 1, wherein either the seed or cap layer includes a combination of at least two of: Iridium, Bismuth, Rhenium, and Gold.

7. The magnetoelectric junction of claim 1, wherein the seed or cap layer further comprises one of: Tantalum, Ruthenium, Platinum, and Palladium.

8. The magnetoelectric junction of claim 1, wherein one of the seed layer and the cap layer is disposed adjacently to one of: the first ferromagnetic fixed layer and the ferromagnetic free layer.

9. The magnetoelectric junction of claim 1, wherein each of the seed layer and the cap layer is disposed adjacently to one of: the first ferromagnetic fixed layer and the ferromagnetic free layer.

10. The magnetoelectric junction of claim 1, further comprising a second dielectric layer disposed proximate the ferromagnetic free layer, wherein the extent of the reduction of the coercivity when a potential difference is applied across the aggregate of the cap layer, the first ferromagnetic fixed layer, the dielectric layer, the ferromagnetic free layer, and the seed layer is enhanced by the presence of the second dielectric layer.

11. The magnetoelectric junction of claim 10, further comprising a second fixed ferromagnetic layer.

12. The magnetoelectric junction of claim 1, further comprising a semi-fixed layer.

* * * * *